(12) United States Patent
Noyes et al.

(10) Patent No.: US 9,509,312 B2
(45) Date of Patent: *Nov. 29, 2016

(54) BOOLEAN LOGIC IN A STATE MACHINE LATTICE

(71) Applicant: Micron Technology, Inc., Boise, ID (US)

(72) Inventors: Harold B Noyes, Boise, ID (US); David R. Brown, Lucas, TX (US); Paul Glendenning, Woodside, CA (US); Irene Junjuan Xu, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/832,543

(22) Filed: Aug. 21, 2015

(65) Prior Publication Data

US 2015/0365091 A1  Dec. 17, 2015

Related U.S. Application Data

(63) Continuation of application No. 14/087,973, filed on Nov. 22, 2013, now Pat. No. 9,118,327, which is a continuation of application No. 13/327,510, filed on Dec. 15, 2011, now Pat. No. 8,593,175.

(51) Int. Cl.
*H03K 19/177* (2006.01)
*H03K 19/20* (2006.01)
(Continued)

(52) U.S. Cl.
CPC ....... *H03K 19/17704* (2013.01); *G05B 19/045* (2013.01); *G06F 9/444* (2013.01); *G06F 17/5054* (2013.01); *H03K 19/20* (2013.01); *G06F 7/00* (2013.01); *H03K 19/0175* (2013.01)

(58) Field of Classification Search
CPC .......... H03K 19/17704; H03K 19/20; G05B 19/045; G06F 9/444; G06F 17/5054
USPC ................................ 326/37–41, 47; 716/116
See application file for complete search history.

(56) References Cited

U.S. PATENT DOCUMENTS 5,028,821 A    7/1991  Kaplinsky
6,611,153 B1 *  8/2003  Lien .................... G06F 17/5054
                                                          326/38
(Continued)

FOREIGN PATENT DOCUMENTS

EP       0476159         3/1992
TW       200813751       3/2008
TW       201005533       2/2010

OTHER PUBLICATIONS

Taiwanese Office Action Mailed Dec. 18, 2014.
(Continued)

*Primary Examiner* — Dylan White
(74) *Attorney, Agent, or Firm* — Fletcher Yoder, P.C.

(57) ABSTRACT

Disclosed are methods and devices, among which is a device that includes a finite state machine lattice. The lattice may includes a programmable Boolean logic cell that may be programmed to perform various logic functions on a data stream. The programmability includes an inversion of a first input to the Boolean logic cell, an inversion of a last output of the Boolean logic cell, and a selection of an AND gate or an OR gate as a final output of the Boolean logic cell. The Boolean logic cell also includes end of data circuitry configured to cause the Boolean logic cell to only output after an end of data signifying the end of a data stream is received at the Boolean logic cell.

27 Claims, 12 Drawing Sheets

(51) Int. Cl.
*G05B 19/045* (2006.01)
*G06F 9/44* (2006.01)
*G06F 17/50* (2006.01)
*H03K 19/0175* (2006.01)
*G06F 7/00* (2006.01)

(56) References Cited

U.S. PATENT DOCUMENTS

| | | | |
|---|---|---|---|
| 6,700,404 | B1 | 3/2004 | Feng et al. |
| 6,880,087 | B1 | 4/2005 | Carter |
| 7,392,229 | B2 | 6/2008 | Harris et al. |
| 7,487,131 | B2 | 2/2009 | Harris et al. |
| 7,487,542 | B2 | 2/2009 | Boulanger |
| 7,774,286 | B1 | 8/2010 | Harris et al. |
| 7,917,684 | B2 | 3/2011 | Noyes |
| 7,970,964 | B2 | 6/2011 | Noyes |
| 8,065,249 | B1 | 11/2011 | Harris et al. |
| 8,140,780 | B2 | 3/2012 | Noyes |
| 8,281,395 | B2 | 10/2012 | Pawlowski |
| 8,593,175 | B2 * | 11/2013 | Noyes ................. G06F 17/5054 326/38 |
| 9,118,327 | B2 * | 8/2015 | Noyes ................. G06F 17/5054 |
| 2006/0288070 | A1 | 12/2006 | Vadi et al. |
| 2010/0100691 | A1 | 4/2010 | Noyes |
| 2010/0100714 | A1 | 4/2010 | Noyes |
| 2010/0115173 | A1 | 5/2010 | Noyes |
| 2010/0115347 | A1 | 5/2010 | Noyes |
| 2010/0118425 | A1 | 5/2010 | Rafaelof |
| 2010/0138432 | A1 | 6/2010 | Noyes |
| 2010/0138575 | A1 | 6/2010 | Noyes |
| 2010/0138634 | A1 | 6/2010 | Noyes |
| 2010/0138635 | A1 | 6/2010 | Noyes |
| 2010/0174887 | A1 | 7/2010 | Pawlowski |
| 2010/0174929 | A1 | 7/2010 | Pawlowski |
| 2010/0175130 | A1 | 7/2010 | Pawlowski |
| 2010/0185647 | A1 | 7/2010 | Noyes |
| 2010/0332809 | A1 | 12/2010 | Noyes |
| 2011/0049816 | A1 * | 3/2011 | Hsu ................. B25B 23/0035 279/30 |
| 2011/0145182 | A1 | 6/2011 | Dlugosch |
| 2011/0145271 | A1 | 6/2011 | Noyes |
| 2011/0145544 | A1 | 6/2011 | Noyes |
| 2011/0145934 | A1 * | 6/2011 | Abramovici ............ G06F 21/76 726/30 |
| 2011/0258360 | A1 | 10/2011 | Noyes |
| 2011/0307433 | A1 | 12/2011 | Dlugosch |
| 2011/0307503 | A1 | 12/2011 | Dlugosch |
| 2012/0179854 | A1 | 7/2012 | Noyes |
| 2012/0192163 | A1 | 7/2012 | Glendenning |
| 2012/0192164 | A1 | 7/2012 | Xu |
| 2012/0192165 | A1 | 7/2012 | Xu |
| 2012/0192166 | A1 | 7/2012 | Xu |
| 2013/0156043 | A1 | 6/2013 | Brown |
| 2013/0159239 | A1 | 6/2013 | Brown |
| 2013/0159670 | A1 | 6/2013 | Noyes |
| 2013/0159671 | A1 | 6/2013 | Brown |

OTHER PUBLICATIONS

International Search Report for application No. PCT/US2012/067992 mailed Mar. 28, 2013.

* cited by examiner

BOOLEAN LOGIC IN A STATE MACHINE LATTICE

CROSS-REFERENCE TO RELATED APPLICATIONS

The present application is a continuation of U.S. application Ser. No. 14/087,973 entitled "Boolean Logic in a State Machine Lattice," and filed Nov. 22, 2013, now U.S. Pat. No. 9,118,327, which issued Aug. 25, 2015, which is a continuation of U.S. application Ser. No. 13/327,510, entitled "Boolean Logic in a State Machine Lattice," and filed Dec. 15, 2011, now U.S. Pat. No. 8,593,175, which issued on Nov. 26, 2013, the entirety of which is incorporated by reference herein for all purposes.

BACKGROUND

Field of Invention

Embodiments of the invention relate generally to electronic devices and, more specifically, in certain embodiments, to parallel finite state machines for pattern-recognition.

Description of Related Art

In the field of computing, pattern recognition tasks are increasingly challenging. Ever larger volumes of data are transmitted between computers, and the number of patterns that users wish to detect is increasing. For example, spam and malware are often detected by searching for patterns in a data stream, e.g., particular phrases or pieces of code. The number of patterns increases with the variety of spam and malware, as new patterns may be implemented to search for new variants.

Recognizing a pattern may often involve determining whether various combinations of matched conditions indicative of the pattern are met. Boolean logic may be implemented to determine various combinations of matched conditions in pattern-recognition computing. For example, AND, OR, NOR, and NAND gates may be used to determine various combinations of matched conditions. The inventors have determined that it may be useful to increase the versatility of Boolean logic by increasing the number of logical operations available for pattern-recognition computing.

DETAILED DESCRIPTION

Figure 1:
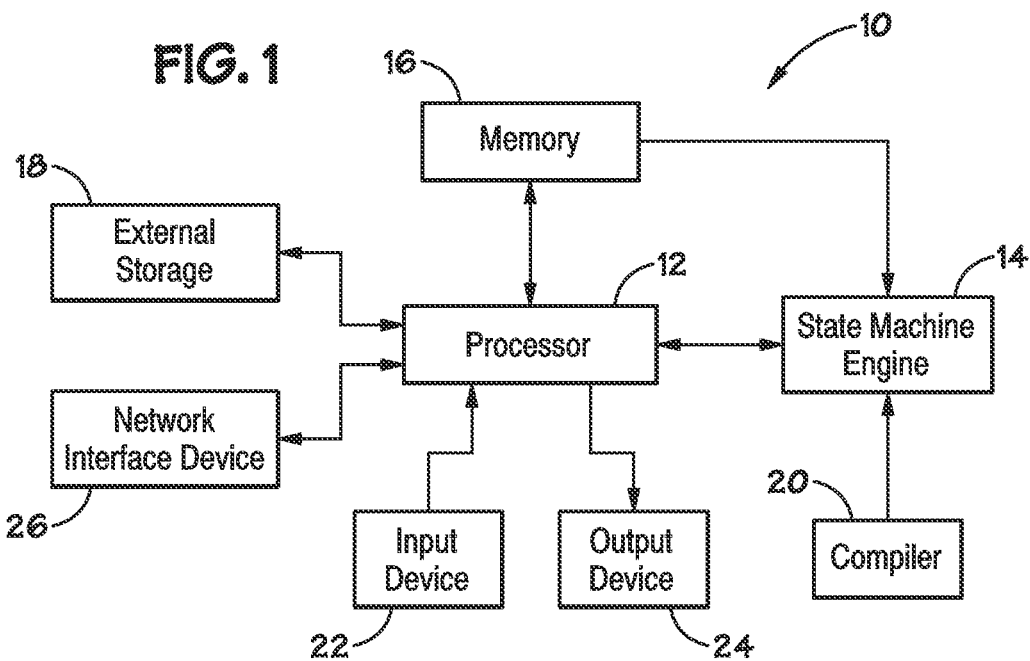
FIG. 1 illustrates an example of system having a state machine engine, according to various embodiments of the invention.

Turning now to the figures, FIG. 1 illustrates an embodiment of a processor-based system, generally designated by reference numeral 10. The system 10 may be any of a variety of types such as a desktop computer, laptop computer, pager, cellular phone, personal organizer, portable audio player, control circuit, camera, etc. The system 10 may also be a network node, such as a router, a server, or a client (e.g., one of the previously-described types of computers). The system 10 may be some other sort of electronic device, such as a copier, a scanner, a printer, a game console, a television, a set-top video distribution or recording system, a cable box, a personal digital media player, a factory automation system, an automotive computer system, or a medical device. (The terms used to describe these various examples of systems, like many of the other terms used herein, may share some referents and, as such, should not be construed narrowly in virtue of the other items listed.)

In a typical processor-based device, such as the system 10, a processor 12, such as a microprocessor, controls the processing of system functions and requests in the system 10. Further, the processor 12 may comprise a plurality of processors that share system control. The processor 12 may be coupled directly or indirectly to each of the elements in the system 10, such that the processor 12 controls the system 10 by executing instructions that may be stored within the system 10 or external to the system 10.

In accordance with the embodiments described herein, the system 10 includes a state machine engine 14, which may operate under control of the processor 12. The state machine engine 14 may employ any one of a number of state machine architectures, including, but not limited to Mealy architectures, Moore architectures, Finite State Machines (FSMs), Deterministic FSMs (DFSMs), Bit-Parallel State Machines (BPSMs), etc. Though a variety of architectures may be used, for discussion purposes, the application refers to FSMs. However, those skilled in the art will appreciate that the described techniques may be employed using any one of a variety of state machine architectures.

As discussed further below, the state machine engine 14 may include a number of (e.g., one or more) finite state machine (FSM) lattices. Each FSM lattice may include multiple FSMs that each receive and analyze the same data in parallel. Further, the FSM lattices may be arranged in groups (e.g., clusters), such that clusters of FSM lattices may analyze the same input data in parallel. Further, clusters of FSM lattices of the state machine engine 14 may be arranged in a hierarchical structure wherein outputs from state machine lattices on a lower level of the hierarchical structure may be used as inputs to state machine lattices on a higher level. By cascading clusters of parallel FSM lattices of the state machine engine 14 in series through the hierarchical structure, increasingly complex patterns may be analyzed (e.g., evaluated, searched, etc.).

Further, based on the hierarchical parallel configuration of the state machine engine 14, the state machine engine 14 can be employed for pattern recognition in systems that utilize high processing speeds. For instance, embodiments described herein may be incorporated in systems with processing speeds of 1 GByte/sec. Accordingly, utilizing the state machine engine 14, data from high speed memory devices or other external devices may be rapidly analyzed for various patterns. The state machine engine 14 may analyze a data stream according to several criteria, and their respective search terms, at about the same time, e.g., during a single device cycle. Each of the FSM lattices within a cluster of FSMs on a level of the state machine engine 14 may each receive the same search term from the data stream at about the same time, and each of the parallel FSM lattices may determine whether the term advances the state machine engine 14 to the next state in the processing criterion. The state machine engine 14 may analyze terms according to a relatively large number of criteria, e.g., more than 100, more than 110, or more than 10,000. Because they operate in parallel, they may apply the criteria to a data stream having a relatively high bandwidth, e.g., a data stream of greater than or generally equal to 1 GByte/sec, without slowing the data stream.

In one embodiment, the state machine engine 14 may be configured to recognize (e.g., detect) a great number of patterns in a data stream. For instance, the state machine engine 14 may be utilized to detect a pattern in one or more of a variety of types of data streams that a user or other entity might wish to analyze. For example, the state machine engine 14 may be configured to analyze a stream of data received over a network, such as packets received over the Internet or voice or data received over a cellular network. In one example, the state machine engine 14 may be configured to analyze a data stream for spam or malware. The data stream may be received as a serial data stream, in which the data is received in an order that has meaning, such as in a temporally, lexically, or semantically significant order. Alternatively, the data stream may be received in parallel or out of order and, then, converted into a serial data stream, e.g., by reordering packets received over the Internet. In some embodiments, the data stream may present terms serially, but the bits expressing each of the terms may be received in parallel. The data stream may be received from a source external to the system 10, or may be formed by interrogating a memory device, such as the memory 16, and forming the data stream from data stored in the memory 16. In other examples, the state machine engine 14 may be configured to recognize a sequence of characters that spell a certain word, a sequence of genetic base pairs that specify a gene, a sequence of bits in a picture or video file that form a portion of an image, a sequence of bits in an executable file that form a part of a program, or a sequence of bits in an audio file that form a part of a song or a spoken phrase. The stream of data to be analyzed may include multiple bits of data in a binary format or other formats, e.g., base ten, ASCII, etc. The stream may encode the data with a single digit or multiple digits, e.g., several binary digits.

As will be appreciated, the system 10 may include memory 16. The memory 16 may include volatile memory, such as Dynamic Random Access Memory (DRAM), Static Random Access Memory (SRAM), Synchronous DRAM (SDRAM), Double Data Rate DRAM (DDR SDRAM), DDR2 SDRAM, DDR3 SDRAM, etc. The memory 16 may also include non-volatile memory, such as read-only memory (ROM), PC-RAM, silicon-oxide-nitride-oxide-silicon (SONOS) memory, metal-oxide-nitride-oxide-silicon (MONOS) memory, polysilicon floating gate based memory, and/or other types of flash memory of various architectures (e.g., NAND memory, NOR memory, etc.) to be used in conjunction with the volatile memory. The memory 16 may include one or more memory devices, such as DRAM devices, that may provide data to be analyzed by the state machine engine 14. Such devices may be referred to as or include solid state drives (SSD's), MultimediaMediaCards (MMC's), SecureDigital (SD) cards, CompactFlash (CF) cards, or any other suitable device. Further, it should be appreciated that such devices may couple to the system 10 via any suitable interface, such as Universal Serial Bus (USB), Peripheral Component Interconnect (PCI), PCI Express (PCI-E), Small Computer System Interface (SCSI), IEEE 1394 (Firewire), or any other suitable interface. To facilitate operation of the memory 16, such as the flash memory devices, the system 10 may include a memory controller (not illustrated). As will be appreciated, the memory controller may be an independent device or it may be integral with the processor 12. Additionally, the system 10 may include an external storage 18, such as a magnetic storage device. The external storage may also provide input data to the state machine engine 14.

The system 10 may include a number of additional elements. For instance, a complier 20 may be used to program the state machine engine 14, as described in more detail with regard to FIG. 8. An input device 22 may also be coupled to the processor 12 to allow a user to input data into the system 10. For instance, an input device 22 may be used to input data into the memory 16 for later analysis by the state machine engine 14. The input device 22 may include buttons, switching elements, a keyboard, a light pen, a stylus, a mouse, and/or a voice recognition system, for instance. An output device 24, such as a display may also be coupled to the processor 12. The display 24 may include an LCD, a CRT, LEDs, and/or an audio display, for example. They system may also include a network interface device 26, such as a Network Interface Card (NIC), for interfacing with a network, such as the Internet. As will be appreciated, the system 10 may include many other components, depending on the application of the system 10.

FIGS. 2-5 illustrate an example of a FSM lattice 30. In an example, the FSM lattice 30 comprises an array of blocks 32. As will be described, each block 32 may include a plurality of selectively couple-able hardware elements (e.g., programmable elements and/or special purpose elements) that correspond to a plurality of states in a FSM. Similar to a state in a FSM, a hardware element can analyze an input stream and activate a downstream hardware element, based on the input stream.

The programmable elements can be programmed to implement many different functions. For instance, the programmable elements may include state machine elements (SMEs) 34, 36 (shown in FIG. 5) that are hierarchically organized into rows 38 (shown in FIGS. 3 and 4) and blocks 32 (shown in FIGS. 2 and 3). To route signals between the hierarchically organized SMEs 34, 36, a hierarchy of programmable switching elements can be used, including inter-block switching elements 40 (shown in FIGS. 2 and 3), intra-block switching elements 42 (shown in FIGS. 3 and 4) and intra-row switching elements 44 (shown in FIG. 4).

As described below, the switching elements may include routing structures and buffers. A SME 34, 36 can correspond to a state of a FSM implemented by the FSM lattice 30. The SMEs 34, 36 can be coupled together by using the programmable switching elements as described below. Accordingly, a FSM can be implemented on the FSM lattice 30 by programming the SMEs 34, 36 to correspond to the functions of states and by selectively coupling together the SMEs 34, 36 to correspond to the transitions between states in the FSM.

Figure 2:
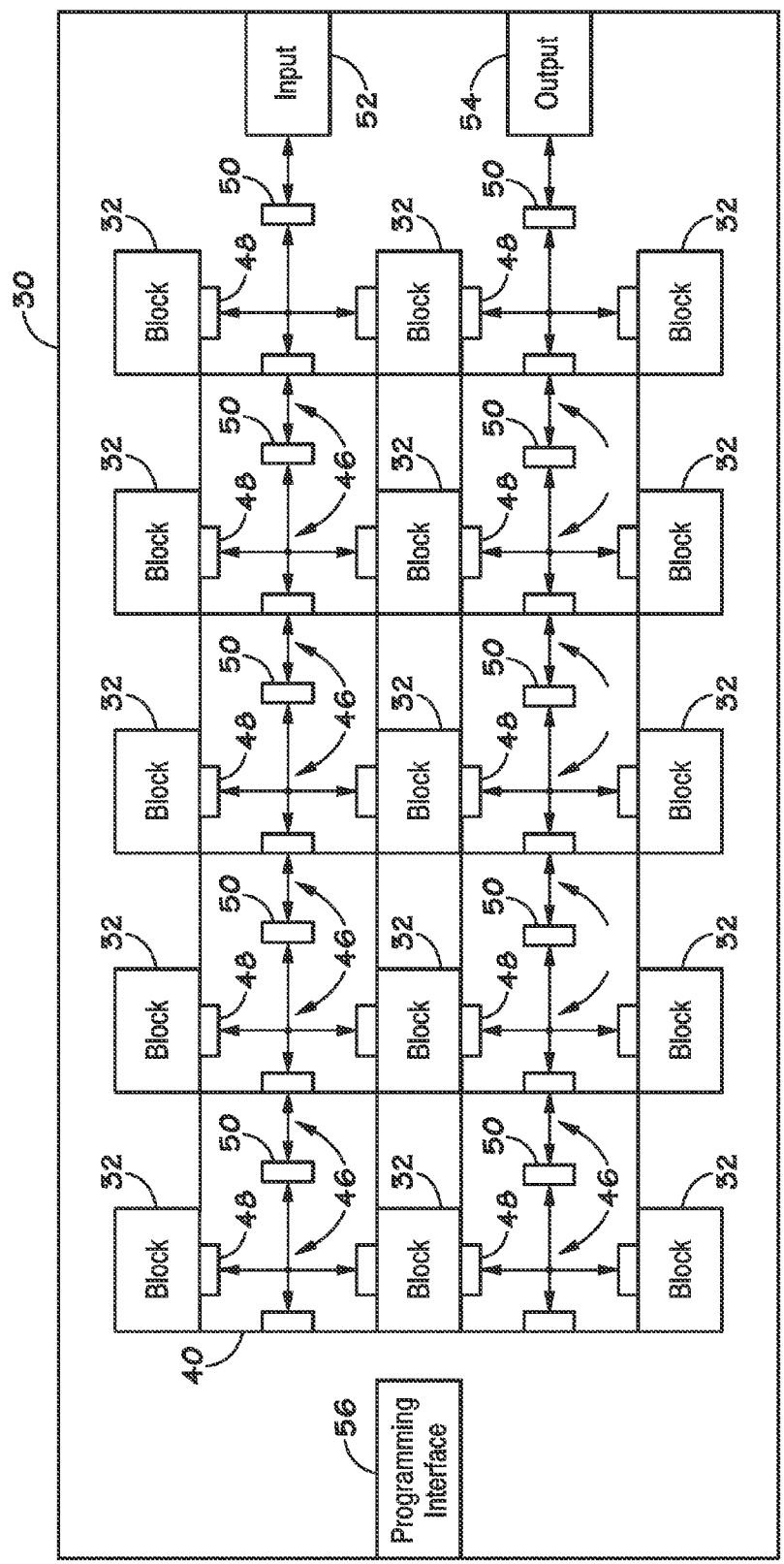
FIG. 2 illustrates an example of an FSM lattice of the state machine engine of FIG. 1, according to various embodiments of the invention.

FIG. 2 illustrates an overall view of an example of a FSM lattice 30. The FSM lattice 30 includes a plurality of blocks 32 that can be selectively coupled together with programmable inter-block switching elements 40. The inter-block switching elements 40 may include conductors 46 (e.g., wires, traces, etc.) and buffers 48 and 50. In an example, buffers 48 and 50 are included to control the connection and timing of signals to/from the inter-block switching elements 40. As described further below, the buffers 48 may be provided to buffer data being sent between blocks 32, while the buffers 50 may be provided to buffer data being sent between inter-block switching elements 40. Additionally, the blocks 32 can be selectively coupled to an input block 52 (e.g., a data input port) for receiving signals (e.g., data) and providing the data to the blocks 32. The blocks 32 can also be selectively coupled to an output block 54 (e.g., an output port) for providing signals from the blocks 32 to an external device (e.g., another FSM lattice 30). The FSM lattice 30 can also include a programming interface 56 to load a program (e.g., an image) onto the FSM lattice 30. The image can program (e.g., set) the state of the SMEs 34, 36. That is, the image can configure the SMEs 34, 36 to react in a certain way to a given input at the input block 52. For example, a SME 34, 36 can be set to output a high signal when the character 'a' is received at the input block 52.

In an example, the input block 52, the output block 54, and/or the programming interface 56 can be implemented as registers such that writing to or reading from the registers provides data to or from the respective elements. Accordingly, bits from the image stored in the registers corresponding to the programming interface 56 can be loaded on the SMEs 34, 36. Although FIG. 2 illustrates a certain number of conductors (e.g., wire, trace) between a block 32, input block 52, output block 54, and an inter-block switching element 40, it should be understood that in other examples, fewer or more conductors may be used.

Figure 3:
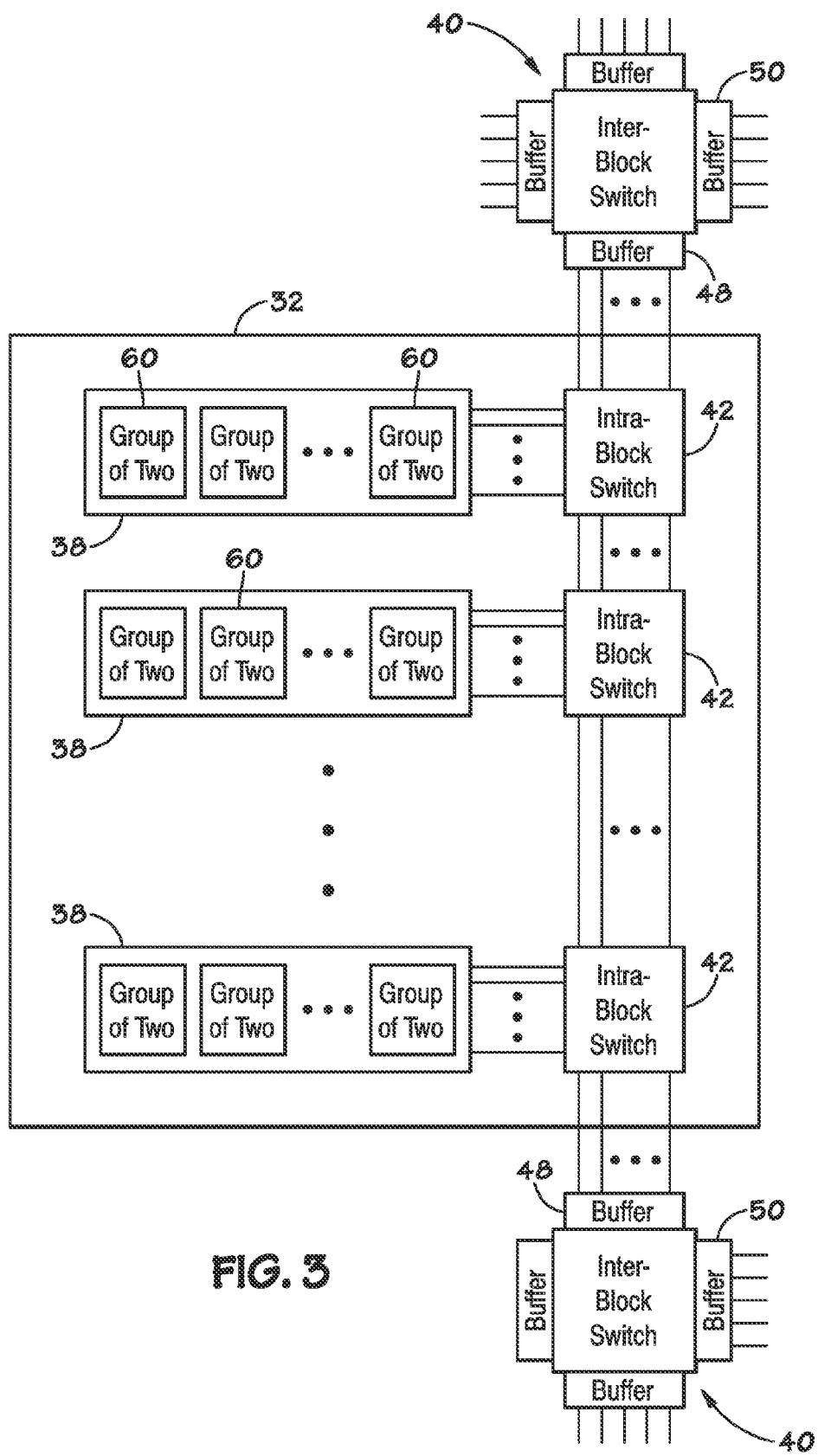
FIG. 3 illustrates an example of a block of the FSM lattice of FIG. 2, according to various embodiments of the invention.

FIG. 3 illustrates an example of a block 32. A block 32 can include a plurality of rows 38 that can be selectively coupled together with programmable intra-block switching elements 42. Additionally, a row 38 can be selectively coupled to another row 38 within another block 32 with the inter-block switching elements 40. A row 38 includes a plurality of SMEs 34, 36 organized into pairs of elements that are referred to herein as groups of two (GOTs) 60. In an example, a block 32 comprises sixteen (16) rows 38.

Figure 4:
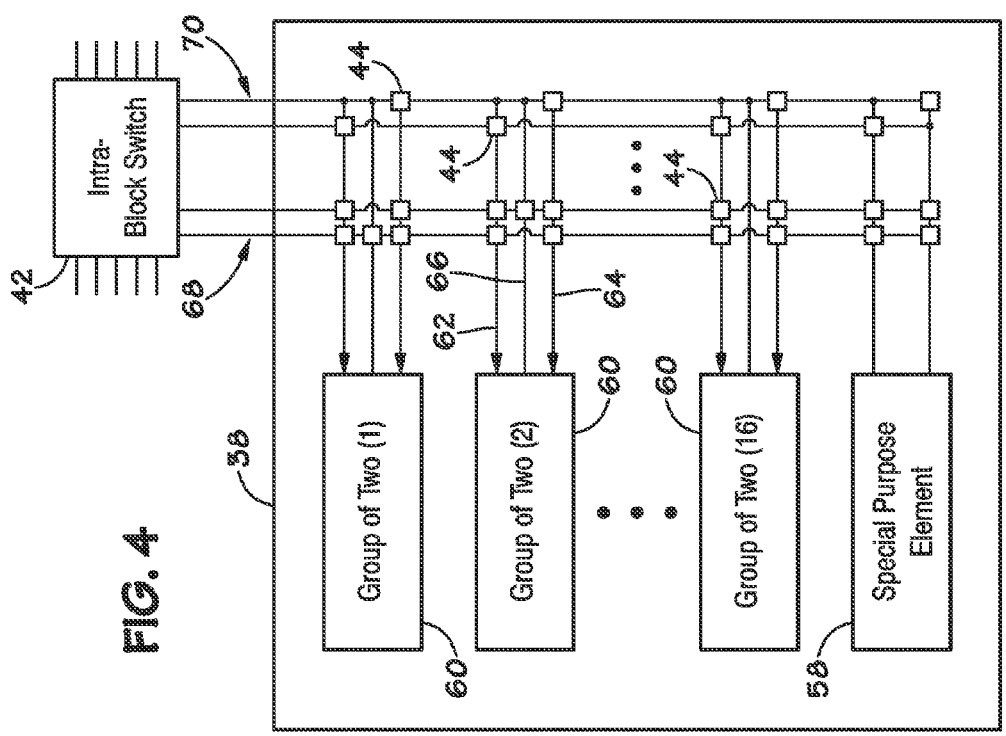
FIG. 4 illustrates an example of a row of the block of FIG. 3, according to various embodiments of the invention.

FIG. 4 illustrates an example of a row 38. A GOT 60 can be selectively coupled to other GOTs 60 and any other elements (e.g., a special purpose element 58) within the row 38 by programmable intra-row switching elements 44. A GOT 60 can also be coupled to other GOTs 60 in other rows 38 with the intra-block switching element 42, or other GOTs 60 in other blocks 32 with an inter-block switching element 40. In an example, a GOT 60 has a first and second input 62, 64, and an output 66. The first input 62 is coupled to a first SME 34 of the GOT 60 and the second input 62 is coupled to a second SME 34 of the GOT 60, as will be further illustrated with reference to FIG. 5.

In an example, the row 38 includes a first and second plurality of row interconnection conductors 68, 70. In an example, an input 62, 64 of a GOT 60 can be coupled to one or more row interconnection conductors 68, 70, and an output 66 can be coupled to one row interconnection conductor 68, 70. In an example, a first plurality of the row interconnection conductors 68 can be coupled to each SME 34, 36 of each GOT 60 within the row 38. A second plurality of the row interconnection conductors 70 can be coupled to only one SME 34, 36 of each GOT 60 within the row 38, but cannot be coupled to the other SME 34, 36 of the GOT 60. In an example, a first half of the second plurality of row interconnection conductors 70 can couple to first half of the SMEs 34, 36 within a row 38 (one SME 34 from each GOT 60) and a second half of the second plurality of row interconnection conductors 70 can couple to a second half of the SMEs 34, 36 within a row 38 (the other SME 34, 36 from each GOT 60), as will be better illustrated with respect to FIG. 5. The limited connectivity between the second plurality of row interconnection conductors 70 and the SMEs 34, 36 is referred to herein as "parity". In an example, the row 38 can also include a special purpose element 58 such as a counter, a programmable Boolean logic element, look-up table, RAM, a field programmable gate array (FPGA), an application specific integrated circuit (ASIC), a programmable processor (e.g., a microprocessor), or other element for performing a special purpose function.

In an example, the special purpose element 58 comprises a counter (also referred to herein as counter 58). In an example, the counter 58 comprises a 12-bit programmable down counter. The 12-bit programmable counter 58 has a counting input, a reset input, and zero-count output. The counting input, when asserted, decrements the value of the counter 58 by one. The reset input, when asserted, causes the counter 58 to load an initial value from an associated register. For the 12-bit counter 58, up to a 12-bit number can be loaded in as the initial value. When the value of the counter 58 is decremented to zero (0), the zero-count output is asserted. The counter 58 also has at least two modes, pulse and hold. When the counter 58 is set to pulse mode, the zero-count output is asserted during the clock cycle when the counter 58 decrements to zero, and at the next clock cycle the zero-count output is no longer asserted. When the counter 58 is set to hold mode the zero-count output is asserted during the clock cycle when the counter 58 decrements to zero, and stays asserted until the counter 58 is reset by the reset input being asserted.

In another example, the special purpose element 58 comprises Boolean logic. In some examples, this Boolean logic can be used to extract information from terminal state SMEs (corresponding to terminal nodes of a FSM, as discussed later herein) in FSM lattice 30. The information extracted can be used to transfer state information to other FSM lattices 30 and/or to transfer programming information used to reprogram FSM lattice 30, or to reprogram another FSM lattice 30.

Figure 5:
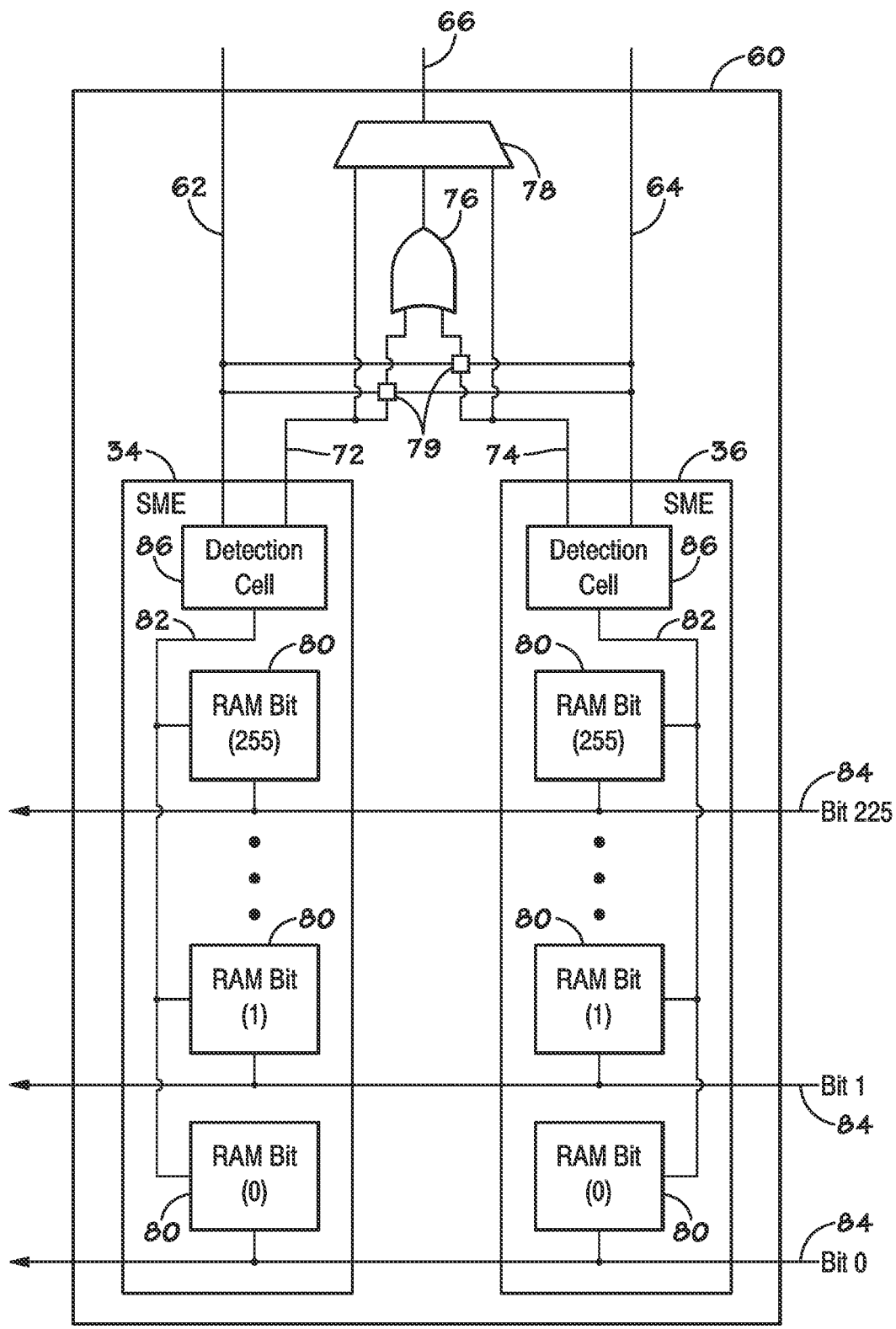
FIG. 5 illustrates an example of a Group of Two of the row of FIG. 4, according to various embodiments of the invention.

FIG. 5 illustrates an example of a GOT 60. The GOT 60 includes a first SME 34 and a second SME 36 having inputs 62, 64 and having their outputs 72, 74 coupled to an OR gate 76 and a 3-to-1 multiplexer 78. The 3-to-1 multiplexer 78 can be set to couple the output 66 of the GOT 60 to either the first SME 34, the second SME 36, or the OR gate 76. The OR gate 76 can be used to couple together both outputs 72, 74 to form the common output 66 of the GOT 60. In an example, the first and second SME 34, 36 exhibit parity, as discussed above, where the input 62 of the first SME 34 can be coupled to some of the row interconnect conductors 68 and the input 64 of the second SME 36 can be coupled to other row interconnect conductors 70. In an example, the two SMEs 34, 36 within a GOT 60 can be cascaded and/or looped back to themselves by setting either or both of switching elements 79. The SMEs 34, 36 can be cascaded by coupling the output 72, 74 of the SMEs 34, 36 to the input 62, 64 of the other SME 34, 36. The SMEs 34, 36 can be looped back to themselves by coupling the output 72, 74 to their own input 62, 64. Accordingly, the output 72 of the first SME 34 can be coupled to neither, one, or both of the input 62 of the first SME 34 and the input 64 of the second SME 36.

In an example, a state machine element 34, 36 comprises a plurality of memory cells 80, such as those often used in dynamic random access memory (DRAM), coupled in parallel to a detect line 82. One such memory cell 80 comprises a memory cell that can be set to a data state, such as one that corresponds to either a high or a low value (e.g., a 1 or 0). The output of the memory cell 80 is coupled to the detect line 82 and the input to the memory cell 80 receives signals based on data on the data stream line 84. In an example, an input on the data stream line 84 is decoded to select one of the memory cells 80. The selected memory cell 80 provides its stored data state as an output onto the detect line 82. For example, the data received at the input block 52 can be provided to a decoder (not shown) and the decoder can select one of the data stream lines 84. In an example, the decoder can convert an 8-bit ACSII character to the corresponding 1 of 256 data stream lines 84.

A memory cell 80, therefore, outputs a high signal to the detect line 82 when the memory cell 80 is set to a high value and the data on the data stream line 84 corresponds to the memory cell 80. When the data on the data stream line 84 corresponds to the memory cell 80 and the memory cell 80 is set to a low value, the memory cell 80 outputs a low signal to the detect line 82. The outputs from the memory cells 80 on the detect line 82 are sensed by a detection cell 86.

In an example, the signal on an input line 62, 64 sets the respective detection cell 86 to either an active or inactive state. When set to the inactive state, the detection cell 86 outputs a low signal on the respective output 72, 74 regardless of the signal on the respective detect line 82. When set to an active state, the detection cell 86 outputs a high signal on the respective output line 72, 74 when a high signal is detected from one of the memory cells 82 of the respective SME 34, 36. When in the active state, the detection cell 86 outputs a low signal on the respective output line 72, 74 when the signals from all of the memory cells 82 of the respective SME 34, 36 are low.

In an example, an SME 34, 36 includes 256 memory cells 80 and each memory cell 80 is coupled to a different data stream line 84. Thus, an SME 34, 36 can be programmed to output a high signal when a selected one or more of the data stream lines 84 have a high signal thereon. For example, the SME 34 can have a first memory cell 80 (e.g., bit 0) set high and all other memory cells 80 (e.g., bits 1-255) set low. When the respective detection cell 86 is in the active state, the SME 34 outputs a high signal on the output 72 when the data stream line 84 corresponding to bit 0 has a high signal thereon. In other examples, the SME 34 can be set to output a high signal when one of multiple data stream lines 84 have a high signal thereon by setting the appropriate memory cells 80 to a high value.

In an example, a memory cell 80 can be set to a high or low value by reading bits from an associated register. Accordingly, the SMEs 34 can be programmed by storing an image created by the compiler 20 into the registers and loading the bits in the registers into associated memory cells 80. In an example, the image created by the compiler 20 includes a binary image of high and low (e.g., 1 and 0) bits. The image can program the FSM lattice 30 to operate as a FSM by cascading the SMEs 34, 36. For example, a first SME 34 can be set to an active state by setting the detection cell 86 to the active state. The first SME 34 can be set to output a high signal when the data stream line 84 corresponding to bit 0 has a high signal thereon. The second SME 36 can be initially set to an inactive state, but can be set to, when active, output a high signal when the data stream line 84 corresponding to bit 1 has a high signal thereon. The first SME 34 and the second SME 36 can be cascaded by setting the output 72 of the first SME 34 to couple to the input 64 of the second SME 36. Thus, when a high signal is sensed on the data stream line 84 corresponding to bit 0, the first SME 34 outputs a high signal on the output 72 and sets the detection cell 86 of the second SME 36 to an active state. When a high signal is sensed on the data stream line 84 corresponding to bit 1, the second SME 36 outputs a high signal on the output 74 to activate another SME 36 or for output from the FSM lattice 30.

In an example, a single FSM lattice 30 is implemented on a single physical device, however, in other examples two or more FSM lattices 30 can be implemented on a single physical device (e.g., physical chip). In an example, each FSM lattice 30 can include a distinct data input block 52, a distinct output block 54, a distinct programming interface 56, and a distinct set of programmable elements. Moreover, each set of programmable elements can react (e.g., output a high or low signal) to data at their corresponding data input block 52. For example, a first set of programmable elements corresponding to a first FSM lattice 30 can react to the data at a first data input block 52 corresponding to the first FSM lattice 30. A second set of programmable elements corresponding to a second FSM lattice 30 can react to a second data input block 52 corresponding to the second FSM lattice 30. Accordingly, each FSM lattice 30 includes a set of programmable elements, wherein different sets of programmable elements can react to different input data. Similarly, each FSM lattice 30, and each corresponding set of programmable elements can provide a distinct output. In some examples, an output block 54 from a first FSM lattice 30 can be coupled to an input block 52 of a second FSM lattice 30, such that input data for the second FSM lattice 30 can include the output data from the first FSM lattice 30 in a hierarchical arrangement of a series of FSM lattices 30.

In an example, an image for loading onto the FSM lattice 30 comprises a plurality of bits of information for configuring the programmable elements, the programmable switching elements, and the special purpose elements within the FSM lattice 30. In an example, the image can be loaded onto the FSM lattice 30 to program the FSM lattice 30 to provide a desired output based on certain inputs. The output block 54 can provide outputs from the FSM lattice 30 based on the reaction of the programmable elements to data at the data input block 52. An output from the output block 54 can include a single bit indicating a match of a given pattern, a word comprising a plurality of bits indicating matches and non-matches to a plurality of patterns, and a state vector corresponding to the state of all or certain programmable elements at a given moment. As described, a number of FSM lattices 30 may be included in a state machine engine, such as state machine engine 14, to perform data analysis, such as pattern-recognition (e.g., speech recognition, image recognition, etc.) signal processing, imaging, computer vision, cryptography, and others.

Figure 6:
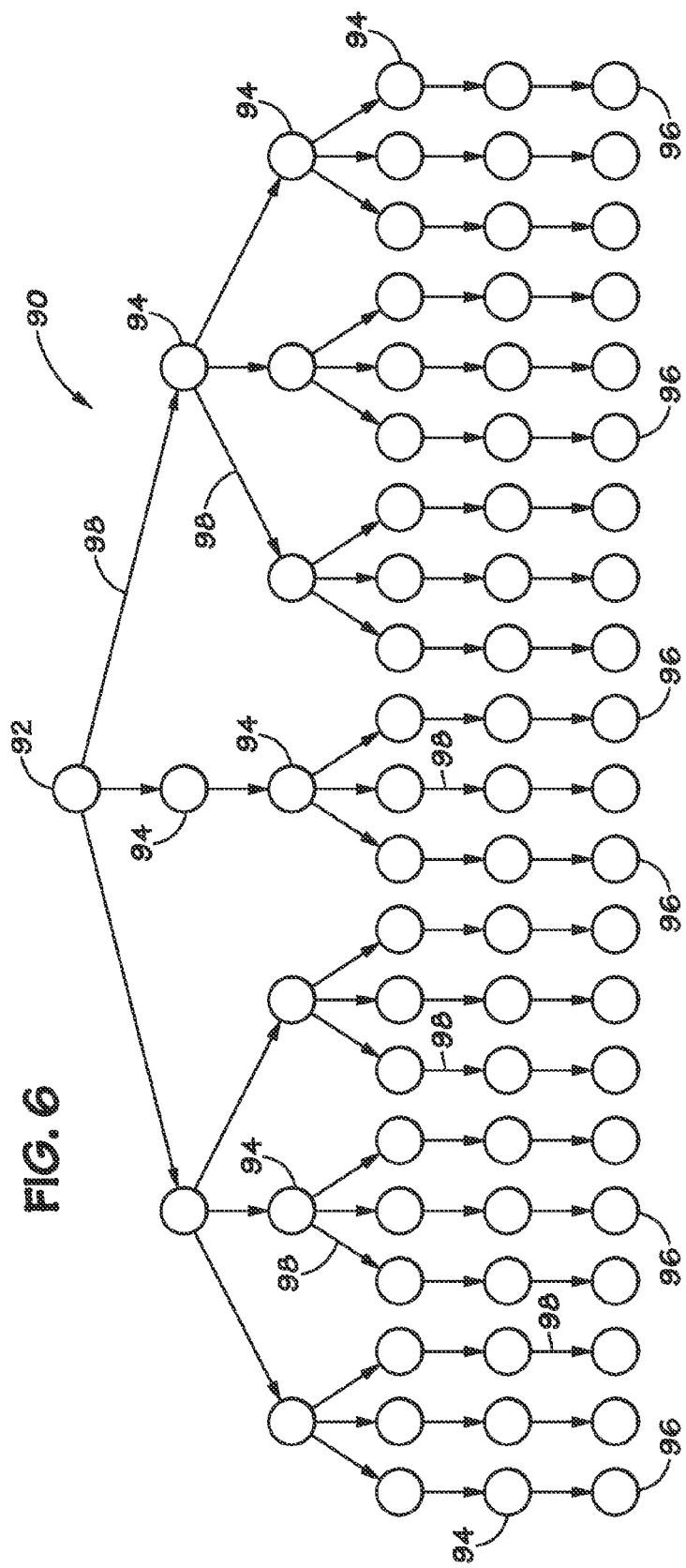
FIG. 6 illustrates an example of a finite state machine graph, according to various embodiments of the invention.

FIG. 6 illustrates an example model of a finite state machine (FSM) that can be implemented by the FSM lattice 30. The FSM lattice 30 can be configured (e.g., programmed) as a physical implementation of a FSM. A FSM can be represented as a diagram 90, (e.g., directed graph, undirected graph, pseudograph), which contains one or more root nodes 92. In addition to the root nodes 92, the FSM can be made up of several standard nodes 94 and terminal nodes 96 that are connected to the root nodes 92 and other standard nodes 94 through one or more edges 98. A node 92, 94, 96 corresponds to a state in the FSM. The edges 98 correspond to the transitions between the states.

Each of the nodes 92, 94, 96 can be in either an active or an inactive state. When in the inactive state, a node 92, 94, 96 does not react (e.g., respond) to input data. When in an active state, a node 92, 94, 96 can react to input data. An upstream node 92, 94 can react to the input data by activating a node 94, 96 that is downstream from the node when the input data matches criteria specified by an edge 98 between the upstream node 92, 94 and the downstream node 94, 96. For example, a first node 94 that specifies the character 'b' will activate a second node 94 connected to the first node 94 by an edge 98 when the first node 94 is active and the character 'b' is received as input data. As used herein, "upstream" refers to a relationship between one or more nodes, where a first node that is upstream of one or more other nodes (or upstream of itself in the case of a loop or feedback configuration) refers to the situation in which the first node can activate the one or more other nodes (or can activate itself in the case of a loop). Similarly, "downstream" refers to a relationship where a first node that is downstream of one or more other nodes (or downstream of itself in the case of a loop) can be activated by the one or more other nodes (or can be activated by itself in the case of a loop). Accordingly, the terms "upstream" and "downstream" are used herein to refer to relationships between one or more nodes, but these terms do not preclude the use of loops or other non-linear paths among the nodes.

In the diagram 90, the root node 92 can be initially activated and can activate downstream nodes 94 when the input data matches an edge 98 from the root node 92. Nodes 94 can activate nodes 96 when the input data matches an edge 98 from the node 94. Nodes 94, 96 throughout the diagram 90 can be activated in this manner as the input data is received. A terminal node 96 corresponds to a match of a sequence of interest by the input data. Accordingly, activation of a terminal node 96 indicates that a sequence of interest has been received as the input data. In the context of the FSM lattice 30 implementing a pattern recognition function, arriving at a terminal node 96 can indicate that a specific pattern of interest has been detected in the input data.

In an example, each root node 92, standard node 94, and terminal node 96 can correspond to a programmable element in the FSM lattice 30. Each edge 98 can correspond to connections between the programmable elements. Thus, a standard node 94 that transitions to (e.g., has an edge 98 connecting to) another standard node 94 or a terminal node 96 corresponds to a programmable element that transitions to (e.g., provides an output to) another programmable element. In some examples, the root node 92 does not have a corresponding programmable element.

When the FSM lattice 30 is programmed, each of the programmable elements can also be in either an active or inactive state. A given programmable element, when inactive, does not react to the input data at a corresponding data input block 52. An active programmable element can react to the input data at the data input block 52, and can activate a downstream programmable element when the input data matches the setting of the programmable element. When a programmable element corresponds to a terminal node 96, the programmable element can be coupled to the output block 54 to provide an indication of a match to an external device.

An image loaded onto the FSM lattice 30 via the programming interface 56 can configure the programmable elements and special purpose elements, as well as the connections between the programmable elements and special purpose elements, such that a desired FSM is implemented through the sequential activation of nodes based on reactions to the data at the data input block 52. In an example, a programmable element remains active for a single data cycle (e.g., a single character, a set of characters, a single clock cycle) and then becomes inactive unless re-activated by an upstream programmable element.

A terminal node 96 can be considered to store a compressed history of past events. For example, the one or more patterns of input data required to reach a terminal node 96 can be represented by the activation of that terminal node 96. In an example, the output provided by a terminal node 96 is binary, that is, the output indicates whether the pattern of interest has been matched or not. The ratio of terminal nodes 96 to standard nodes 94 in a diagram 90 may be quite small. In other words, although there may be a high complexity in the FSM, the output of the FSM may be small by comparison.

In an example, the output of the FSM lattice 30 can comprise a state vector. The state vector comprises the state (e.g., activated or not activated) of programmable elements of the FSM lattice 30. In an example, the state vector includes the states for the programmable elements corresponding to terminal nodes 96. Thus, the output can include a collection of the indications provided by all terminal nodes 96 of a diagram 90. The state vector can be represented as a word, where the binary indication provided by each terminal node 96 comprises one bit of the word. This encoding of the terminal nodes 96 can provide an effective indication of the detection state (e.g., whether and what sequences of interest have been detected) for the FSM lattice 30. In another example, the state vector can include the state of all or a subset of the programmable elements whether or not the programmable elements corresponds to a terminal node 96.

As mentioned above, the FSM lattice 30 can be programmed to implement a pattern recognition function. For example, the FSM lattice 30 can be configured to recognize one or more data sequences (e.g., signatures, patterns) in the input data. When a data sequence of interest is recognized by the FSM lattice 30, an indication of that recognition can be provided at the output block 54. In an example, the pattern recognition can recognize a string of symbols (e.g., ASCII characters) to; for example, identify malware or other information in network data.

Figure 7:
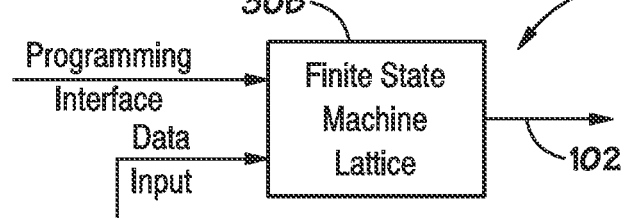
FIG. 7 illustrates an example of two-level hierarchy implemented with FSM lattices, according to various embodiments of the invention.
Figure 7:
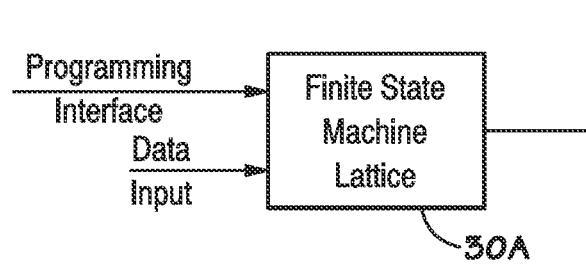

FIG. 7 illustrates an example of hierarchical structure 100, wherein two levels of FSM lattices 30 are coupled in series and used to analyze data. Specifically, in the illustrated embodiment, the hierarchical structure 100 includes a first FSM lattice 30A and a second FSM lattice 30B arranged in series. Each FSM lattice 30 includes a respective data input block 52 to receive data input, a programming interface block 56 to receive programming signals and an output block 54.

The first FSM lattice 30A is configured to receive input data, for example, raw data at a data input block. The first FSM lattice 30A reacts to the input data as described above and provides an output at an output block. The output from the first FSM lattice 30A is sent to a data input block of the second FSM lattice 30B. The second FSM lattice 30B can then react based on the output provided by the first FSM lattice 30A and provide a corresponding output signal 102 of the hierarchical structure 100. This hierarchical coupling of two FSM lattices 30A and 30B in series provides a means to transfer information regarding past events in a compressed word from a first FSM lattice 30A to a second FSM lattice 30B. The information transferred can effectively be a summary of complex events (e.g., sequences of interest) that were recorded by the first FSM lattice 30A.

The two-level hierarchy 100 of FSM lattices 30A, 30B shown in FIG. 7 allows two independent programs to operate based on the same data stream. The two-stage hierarchy can be similar to visual recognition in a biological brain which is modeled as different regions. Under this model, the regions are effectively different pattern recognition engines, each performing a similar computational function (pattern matching) but using different programs (signatures). By connecting multiple FSM lattices 30A, 30B together, increased knowledge about the data stream input may be obtained.

The first level of the hierarchy (implemented by the first FSM lattice 30A) can, for example, perform processing directly on a raw data stream. That is, a raw data stream can be received at an input block 52 of the first FSM lattice 30A and the programmable elements of the first FSM lattice 30A can react to the raw data stream. The second level (implemented by the second FSM lattice 30B) of the hierarchy can process the output from the first level. That is, the second FSM lattice 30B receives the output from an output block 54 of the first FSM lattice 30A at an input block 52 of the second FSM lattice 30B and the programmable elements of the second FSM lattice 30B can react to the output of the first FSM lattice 30A. Accordingly, in this example, the second FSM lattice 30B does not receive the raw data stream as an input, but rather receives the indications of patterns of interest that are matched by the raw data stream as determined by the first FSM lattice 30A. The second FSM lattice 30B can implement a FSM that recognizes patterns in the output data stream from the first FSM lattice 30A.

Figure 8:
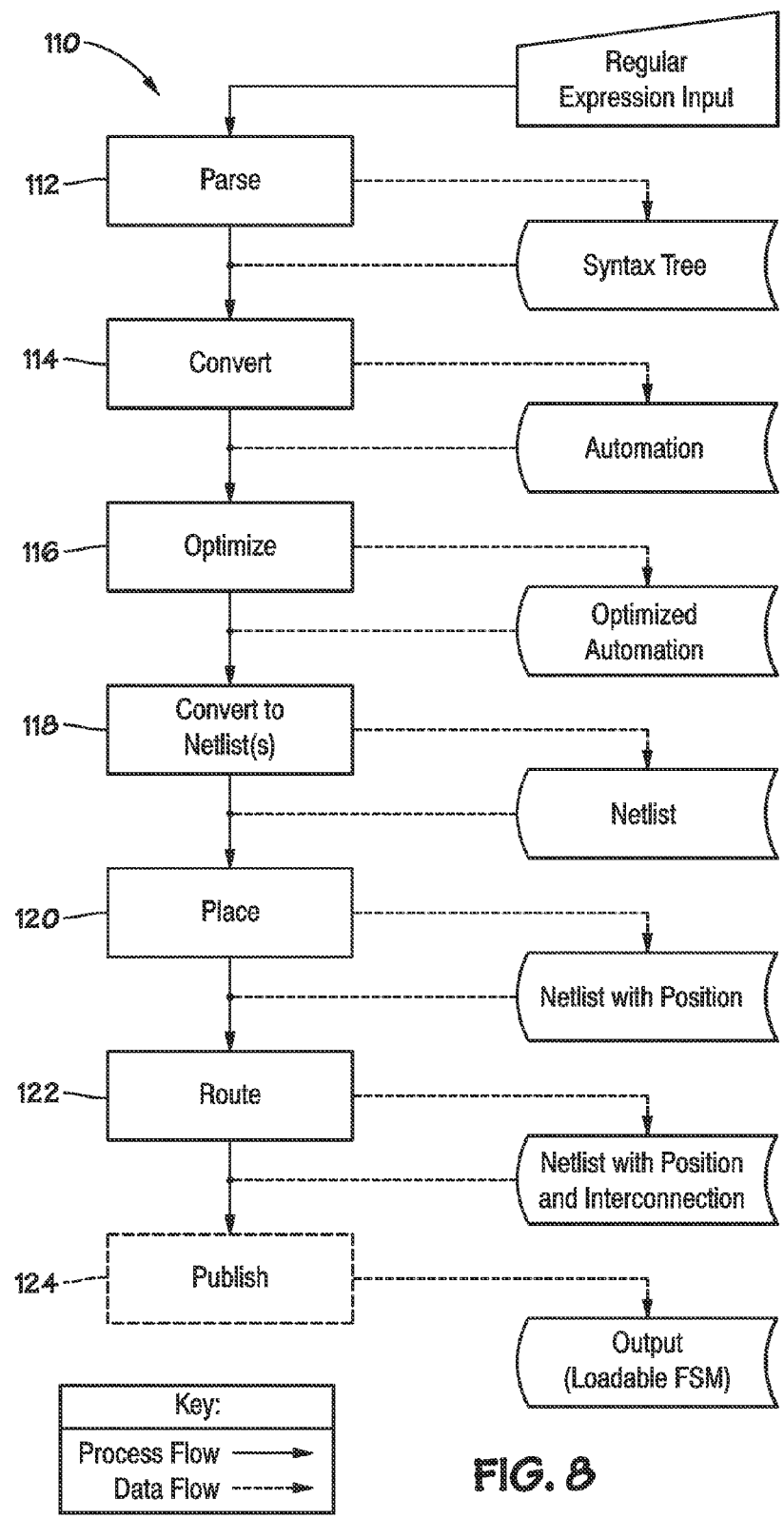
FIG. 8 illustrates an example of a method for a compiler to convert source code into a binary file for programming of the FSM lattice of FIG. 2, according to various embodiments of the invention.

FIG. 8 illustrates an example of a method 110 for a compiler to convert source code into an image configured to program a FSM lattice, such as lattice 30, to implement a FSM. Method 110 includes parsing the source code into a syntax tree (block 112), converting the syntax tree into an automaton (block 114), optimizing the automaton (block 116), converting the automaton into a netlist (block 118), placing the netlist on hardware (block 120), routing the netlist (block 122), and publishing the resulting image (block 124).

In an example, the compiler 20 includes an application programming interface (API) that allows software developers to create images for implementing FSMs on the FSM lattice 30. The compiler 20 provides methods to convert an input set of regular expressions in the source code into an image that is configured to program the FSM lattice 30. The compiler 20 can be implemented by instructions for a computer having a von Neumann architecture. These instructions can cause a processor 12 on the computer to implement the functions of the compiler 20. For example, the instructions, when executed by the processor 12, can cause the processor 12 to perform actions as described in blocks 112, 114, 116, 118, 120, 122, and 124 on source code that is accessible to the processor 12.

In an example, the source code describes search strings for identifying patterns of symbols within a group of symbols. To describe the search strings, the source code can include a plurality of regular expressions (regexs). A regex can be a string for describing a symbol search pattern. Regexes are widely used in various computer domains, such as programming languages, text editors, network security, and others. In an example, the regular expressions supported by the compiler include criteria for the analysis of unstructured data. Unstructured data can include data that is free form and has no indexing applied to words within the data. Words can include any combination of bytes, printable and non-printable, within the data. In an example, the compiler can support multiple different source code languages for implementing regexes including Perl, (e.g., Perl compatible regular expressions (PCRE)), PHP, Java, and .NET languages.

At block 112 the compiler 20 can parse the source code to form an arrangement of relationally connected operators, where different types of operators correspond to different functions implemented by the source code (e.g., different functions implemented by regexes in the source code). Parsing source code can create a generic representation of the source code. In an example, the generic representation comprises an encoded representation of the regexs in the source code in the form of a tree graph known as a syntax tree. The examples described herein refer to the arrangement as a syntax tree (also known as an "abstract syntax tree") in other examples, however, a concrete syntax tree or other arrangement can be used.

Since, as mentioned above, the compiler 20 can support multiple languages of source code, parsing converts the source code, regardless of the language, into a non-language specific representation, e.g., a syntax tree. Thus, further processing (blocks 114, 116, 118, 120) by the compiler 20 can work from a common input structure regardless of the language of the source code.

As noted above, the syntax tree includes a plurality of operators that are relationally connected. A syntax tree can include multiple different types of operators. That is, different operators can correspond to different functions implemented by the regexes in the source code.

At block 114, the syntax tree is converted into an automaton. An automaton comprises a software model of a FSM and can accordingly be classified as deterministic or non-deterministic. A deterministic automaton has a single path of execution at a given time, while a non-deterministic automaton has multiple concurrent paths of execution. The automaton comprises a plurality of states. In order to convert the syntax tree into an automaton, the operators and relationships between the operators in the syntax tree are converted into states with transitions between the states. In an example, the automaton can be converted based partly on the hardware of the FSM lattice 30.

In an example, input symbols for the automaton include the symbols of the alphabet, the numerals 0-9, and other printable characters. In an example, the input symbols are represented by the byte values 0 through 255 inclusive. In an example, an automaton can be represented as a directed graph where the nodes of the graph correspond to the set of states. In an example, a transition from state p to state q on an input symbol α, i.e. δ(p,α), is shown by a directed connection from node p to node q. In an example, a reversal of an automaton produces a new automaton where each transition p→q on some symbol α is reversed q→p on the same symbol. In a reversal, start state becomes a final state and the final states become start states. In an example, the language recognized (e.g., matched) by an automaton is the set of all possible character strings which when input sequentially into the automaton will reach a final state. Each string in the language recognized by the automaton traces a path from the start state to one or more final states.

At block 116, after the automaton is constructed, the automaton is optimized to, among other things, reduce its complexity and size. The automaton can be optimized by combining redundant states.

At block 118, the optimized automaton is converted into a netlist. Converting the automaton into a netlist maps each state of the automaton to a hardware element (e.g., SMEs 34, 36, other elements) on the FSM lattice 30, and determines the connections between the hardware elements.

At block 120, the netlist is placed to select a specific hardware element of the target device (e.g., SMEs 34, 36, special purpose elements 58) corresponding to each node of the netlist. In an example, placing selects each specific hardware element based on general input and output constraints for of the FSM lattice 30.

At block 122, the placed netlist is routed to determine the settings for the programmable switching elements (e.g., inter-block switching elements 40, intra-block switching elements 42, and intra-row switching elements 44) in order to couple the selected hardware elements together to achieve the connections describe by the netlist. In an example, the settings for the programmable switching elements are determined by determining specific conductors of the FSM lattice 30 that will be used to connect the selected hardware elements, and the settings for the programmable switching elements. Routing can take into account more specific limitations of the connections between the hardware elements that placement at block 120. Accordingly, routing may adjust the location of some of the hardware elements as determined by the global placement in order to make appropriate connections given the actual limitations of the conductors on the FSM lattice 30.

Once the netlist is placed and routed, the placed and routed netlist can be converted into a plurality of bits for programming of a FSM lattice 30. The plurality of bits are referred to herein as an image.

At block 124, an image is published by the compiler 20. The image comprises a plurality of bits for programming specific hardware elements of the FSM lattice 30. In embodiments where the image comprises a plurality of bits (e.g., 0 and 1), the image can be referred to as a binary image. The bits can be loaded onto the FSM lattice 30 to program the state of SMEs 34, 36, the special purpose elements 58, and the programmable switching elements such that the programmed FSM lattice 30 implements a FSM having the functionality described by the source code. Placement (block 120) and routing (block 122) can map specific hardware elements at specific locations in the FSM lattice 30 to specific states in the automaton. Accordingly, the bits in the image can program the specific hardware elements to implement the desired function(s). In an example, the image can be published by saving the machine code to a computer readable medium. In another example, the image can be published by displaying the image on a display device. In still another example, the image can be published by sending the image to another device, such as a programming device for loading the image onto the FSM lattice 30. In yet another example, the image can be published by loading the image onto a FSM lattice (e.g., the FSM lattice 30).

In an example, an image can be loaded onto the FSM lattice 30 by either directly loading the bit values from the image to the SMEs 34, 36 and other hardware elements or by loading the image into one or more registers and then writing the bit values from the registers to the SMEs 34, 36 and other hardware elements. In an example, the hardware elements (e.g., SMEs 34, 36, special purpose elements 58, programmable switching elements 40, 42, 44) of the FSM lattice 30 are memory mapped such that a programming device and/or computer can load the image onto the FSM lattice 30 by writing the image to one or more memory addresses.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, the code may be tangibly stored on one or more volatile or non-volatile computer-readable media during execution or at other times. These computer-readable media may include, but are not limited to, hard disks, removable magnetic disks, removable optical disks (e.g., compact disks and digital video disks), magnetic cassettes, memory cards or sticks, random access memories (RAMs), read only memories (ROMs), and the like.

Figure 9:
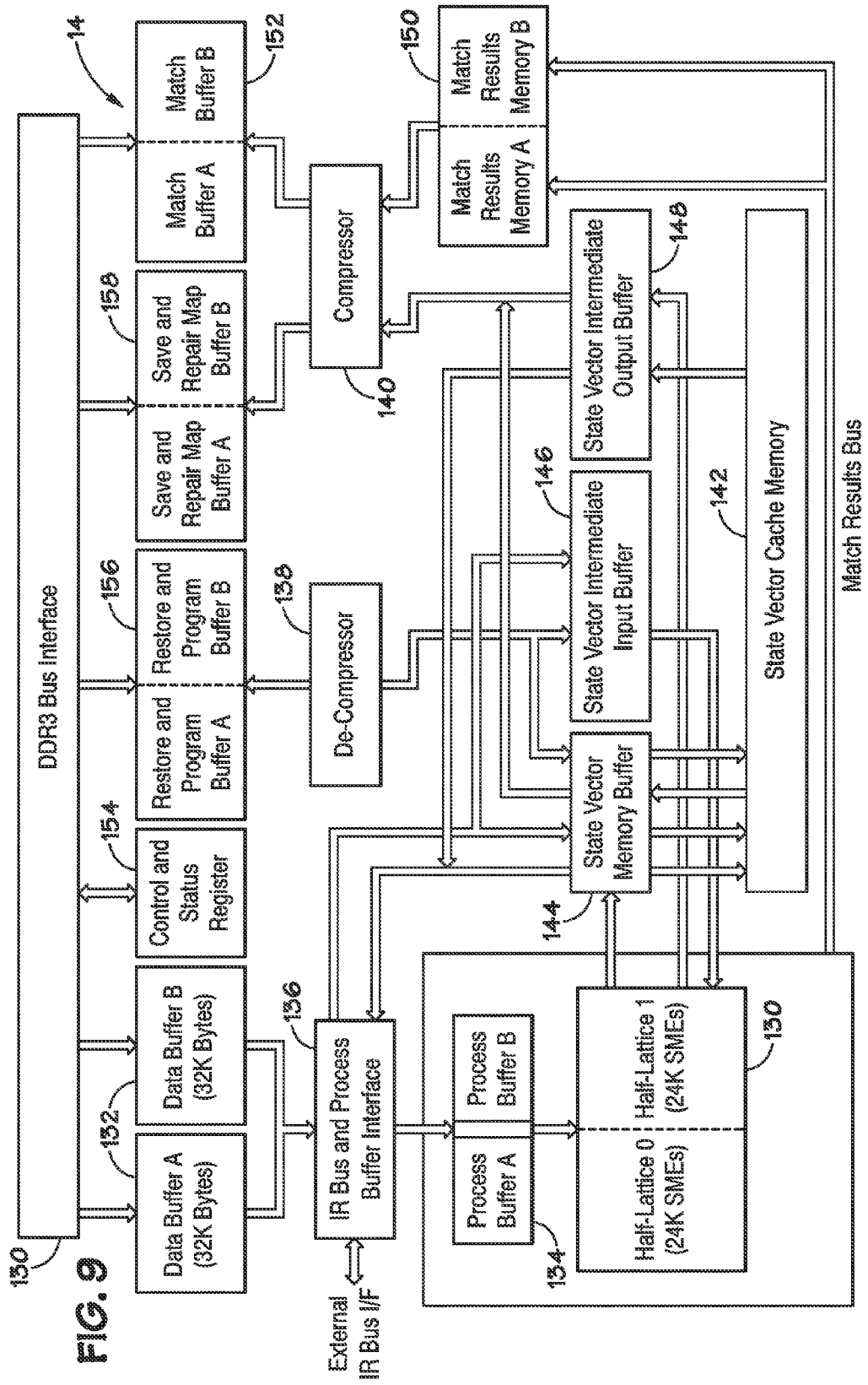
FIG. 9 illustrates a state machine engine, according to various embodiments of the invention.

Referring now to FIG. 9, an embodiment of the state machine engine 14 is illustrated. As previously described, the state machine engine 14 is configured to receive data from a source, such as the memory 16 over a data bus. In the illustrated embodiment, data may be sent to the state machine engine 14 through a bus interface, such as a DDR3 bus interface 130. The DDR3 bus interface 130 may be capable of exchanging data at a rate greater than or equal to 1 GByte/sec. As will be appreciated, depending on the source of the data to be analyzed, the bus interface 130 may be any suitable bus interface for exchanging data to and from a data source to the state machine engine 14, such as a NAND Flash interface, PCI interface, etc. As previously described, the state machine engine 14 includes one or more FSM lattices 30 configured to analyze data. Each FSM lattice 30 may be divided into two half-lattices. In the illustrated embodiment, each half lattice may include 24K SMEs (e.g., SMEs 34, 36), such that the lattice 30 includes 48K SMEs. The lattice 30 may comprise any desirable number of SMEs, arranged as previously described with regard to FIGS. 2-5. Further, while only one FSM lattice 30 is illustrated, the state machine engine 14 may include multiple FSM lattices 30, as previously described.

Data to be analyzed may be received at the bus interface 130 and transmitted to the FSM lattice 30 through a number of buffers and buffer interfaces. In the illustrated embodiment, the data path includes data buffers 132, process buffers 134 and an inter-rank (IR) bus and process buffer interface 136. The data buffers 132 are configured to receive and temporarily store data to be analyzed. In one embodiment, there are two data buffers 132 (data buffer A and data buffer B). Data may be stored in one of the two data buffers 132, while data is being emptied from the other data buffer 132, for analysis by the FSM lattice 30. In the illustrated embodiment, the data buffers 132 may be 32 KBytes each. The IR bus and process buffer interface 136 may facilitate the transfer of data to the process buffer 134. The IR bus and process buffer 136 ensures that data is processed by the FSM lattice 30 in order. The IR bus and process buffer 136 may coordinate the exchange of data, timing information, packing instructions, etc. such that data is received and analyzed in the correct order. Generally, the IR bus and process buffer 136 allows the analyzing of multiple data sets in parallel through logical ranks of FSM lattices 30.

In the illustrated embodiment, the state machine engine 14 also includes a de-compressor 138 and a compressor 140 to aid in the transfer of the large amounts of data through the state machine engine 14. The compressor 140 and de-compressor 138 work in conjunction such that data can be compressed to minimize the data transfer times. By compressing the data to be analyzed, the bus utilization time may be minimized. Based on information provided by the compiler 20, a mask may be provided to the state machine engine 14 to provide information on which state machines are likely to be unused. The compressor 140 and de-compressor 138 can also be configured to handle data of varying burst lengths. By padding compressed data and including an indicator as to when each compressed region ends, the compressor 140 may improve the overall processing speed through the state machine engine 14. The compressor 140 and de-compressor 138 may also be used to compress and decompress match results data after analysis by the FSM lattice 30.

As previously described, the output of the FSM lattice 30 can comprise a state vector. The state vector comprises the state (e.g., activated or not activated) of programmable elements of the FSM lattice 30. Each state vector may be temporarily stored in the state vector cache memory 142 for further hierarchical processing and analysis. That is, the state of each state machine may be stored, such that the final state may be used in further analysis, while freeing the state machines for reprogramming and/or further analysis of a new data set. Like a typical cache, the state vector cache memory allows storage of information, here state vectors, for quick retrieval and use, here by the FSM lattice 30, for instance. Additional buffers, such as the state vector memory buffer, state vector intermediate input buffer 146 and state vector intermediate output buffer 148, may be utilized in conjunction with the state vector cache memory 142 to accommodate rapid analysis and storage of state vectors, while adhering to packet transmission protocol through the state machine engine 14.

Once a result of interest is produced by the FSM lattice 30, match results may be stored in a match results memory 150. That is, a "match vector" indicating a match (e.g., detection of a pattern of interest) may be stored in the match results memory 150. The match result can then be sent to a match buffer 152 for transmission over the bus interface 130 to the processor 12, for example. As previously described, the match results may be compressed.

Additional registers and buffers may be provided in the state machine engine 14, as well. For instance, the state machine engine 14 may include control and status registers 154. In addition, restore and program buffers 156 may be provided for using in programming the FSM lattice 30 initially, or restoring the state of the machines in the FSM lattice 30 during analysis. Similarly, save and repair map buffers 158 may also be provided for storage of save and repair maps for setup and usage.

As discussed, in some embodiments, each of the rows 38 in the block 32 may include one or more special purpose elements 58 such as a counter, a programmable Boolean logic cell, a look-up table RAM, a field programmable gate array (FPGA), an application specific integrated circuit (ASIC), a programmable processor (e.g., microprocessor), or other element for performing a special purpose function. The special purpose element 58 may be connected to intra-row switching elements with one or more GOT 60 in each row 38. Furthermore, outputs from each row 38 may be connected to intra-block switching elements 42, which may be connected by inter-block switching elements 40.

Figure 10:
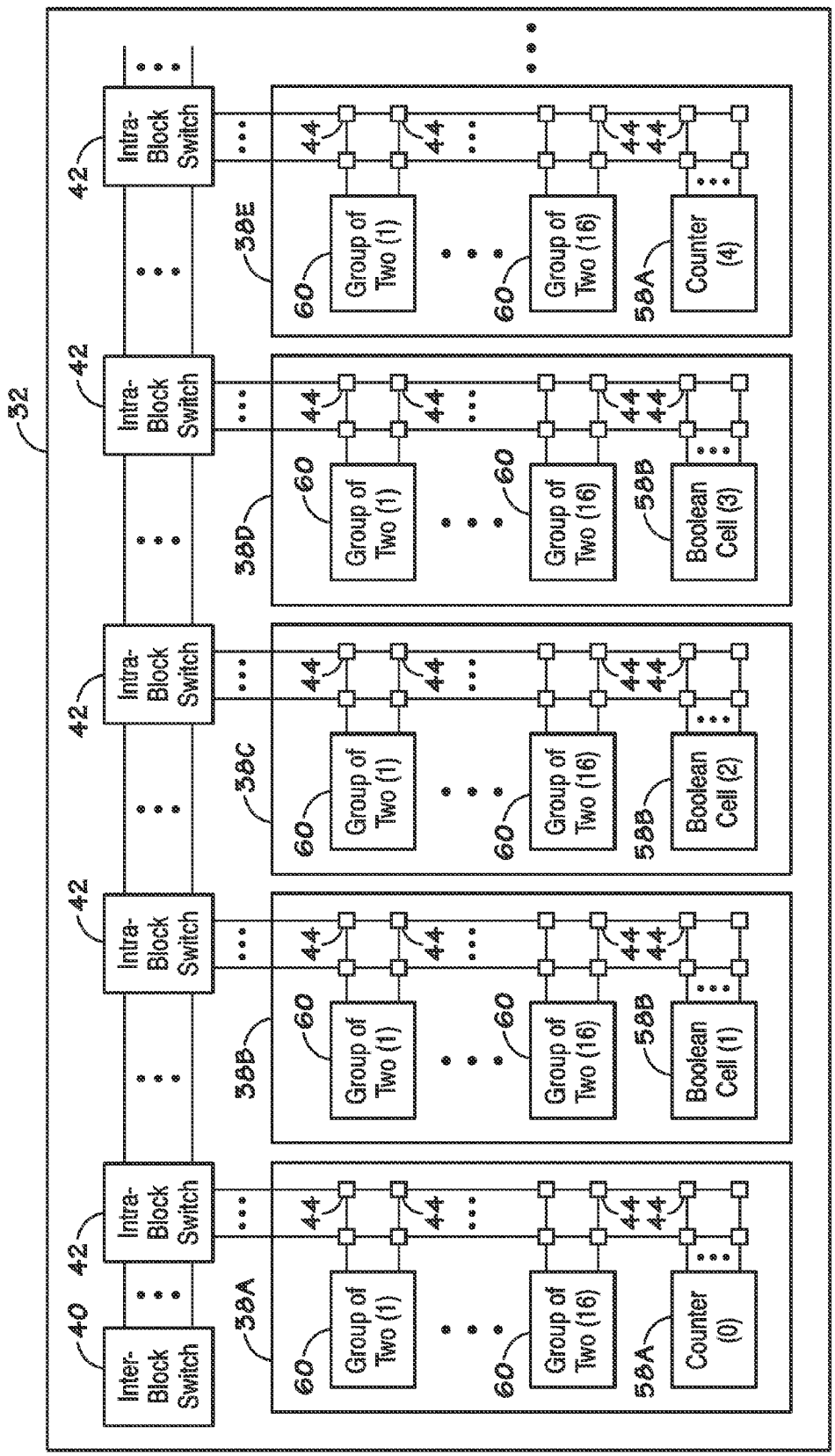
FIG. 10 illustrates a block as in FIG. 3 having Boolean logic cells in rows of the block, according to various embodiments of the invention.

FIG. 10 is an illustration of an example of a block 32 having rows 38 that each include a special purpose element 58. For example, the special purpose elements 58 in the block 32 may include counter cells 58A and Boolean logic cells 58B. While only the rows 38 in row positions 0 through 4 are illustrated in FIG. 10 (e.g., labeled 38A through 38E), each block 32 may have any number of rows 38 (e.g., 16 rows 38), and one or more special purpose elements 58 may be configured in each of the rows 38. For example, in one embodiment, counter cells 58A may be configured in certain rows 38 (e.g., in row positions 0, 4, 8, and 12), while the Boolean logic cells 58B may be configured in the remaining of the 16 rows 38 (e.g., in row positions 1, 2, 3, 5, 6, 7, 9, 10, 11, 13, 14, 15, and 16). The GOTs 60 and the special purpose elements 58 may be selectively coupled to elements in the lattice through intra-row switching elements 44, intra-block switching elements 42, and/or inter-block switching elements 40.

It should be noted that while FIG. 10 depicts each row 38 as having one counter cell 58A or one Boolean logic cell 58B, the rows 38 are not limited to having only one special purpose element 58. For example, in some embodiments, one or more rows 38 may have one or more counters 58A, as well as additional special purpose elements 58. The special purpose elements 58, including the counters 58A, may be able to communicate with other special purpose elements 58 via, for example, intra-row switching elements 44 within a row 38. Furthermore, the counters 58A are not limited to 12-bit decrementing counters. In some embodiments, suitable counters of different bit sizes and/or counters that increment to a initial value may also be used.

In some embodiments, each active GOT 60 in each row 38 may output a signal indicating the detection of one or more conditions, and the special purpose elements 58 may receive the outputs of GOTs 60 selectively coupled thereto to perform at least one of various possible functions. For example, the Boolean logic cells 58B may be used to perform logical functions, such as AND, OR, NAND, NOR, Sum of Products (SoP), Negated-Output Sum of Products (NSoP), Negated-Output Product of Sum (NPoS), and Product of Sums (PoS) functions. Furthermore, outputs from the counter 58A and/or the Boolean logic cell 58B may be communicated through, for example, the intra-row switching elements 44 and the intra-block switching elements 42 to perform counting or logic functions with greater complexity. In some embodiments, different special purpose elements 58 such as counters 58A and Boolean logic cells 58B may be used together. For example, an output of one or more Boolean logic cells 58B may be counted by one or more counters 58A in a block 32.

Figure 11:
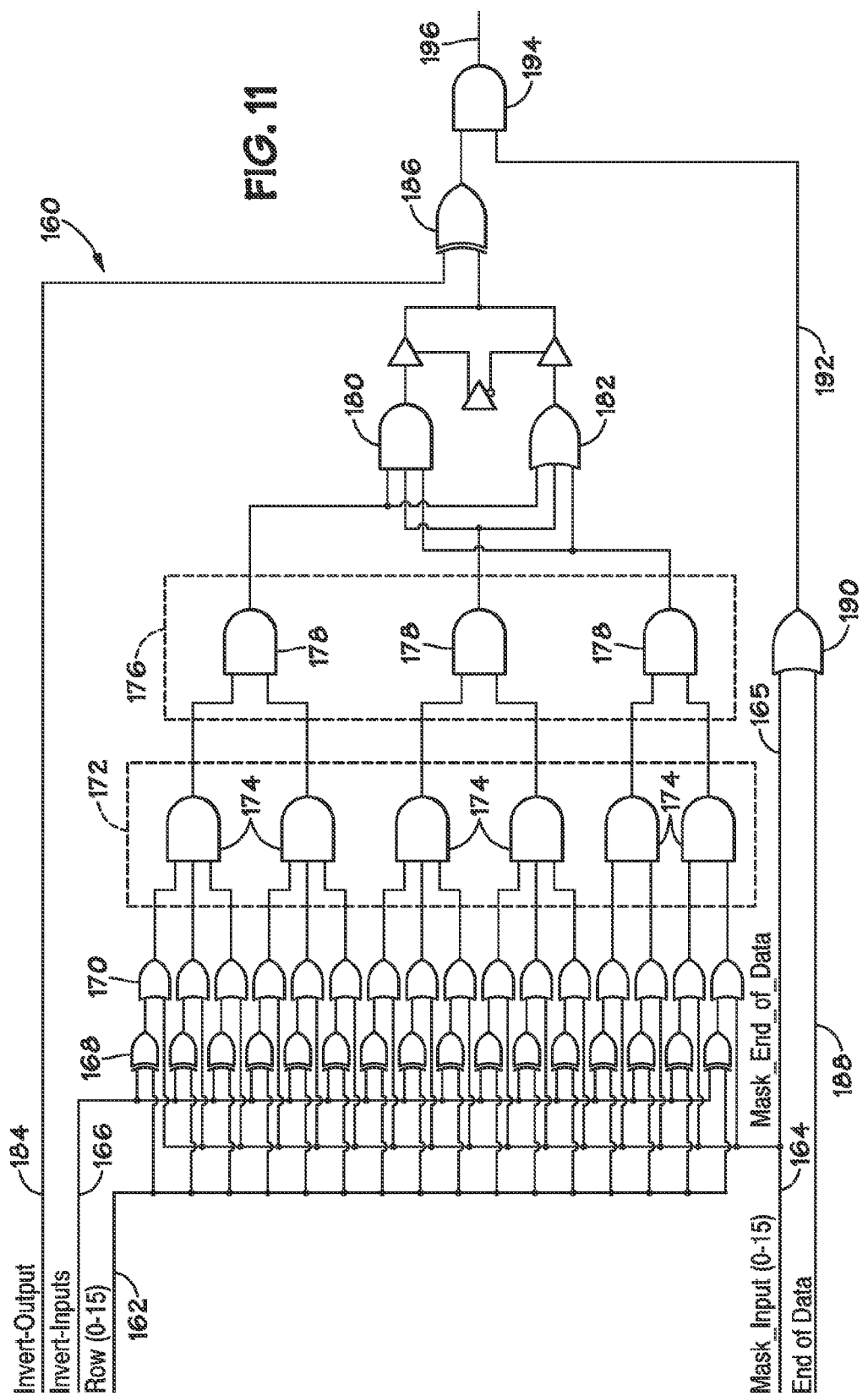
FIG. 11 illustrates a circuit representation of the Boolean logic cell of FIG. 10, according to various embodiments of the invention.

While the possible connections between the Boolean logic cells 58B and the other elements of the block 32 are simplified in FIG. 10, the Boolean logic cells 58B may have multiple inputs which may be selectively coupled to, for example, GOTs 60, as well as multiple programmable inputs. A representation of a Boolean logic cell 58B is illustrated in the logic diagram 160 of FIG. 11. The logic diagram 160 is one example of a configuration of logic elements in the Boolean logic cell 58B. In some embodiments, the Boolean logic cell 58B may have three programmable bits. A first programmable bit includes inverting a first input of the cell 58B, a second programmable bit includes inverting a last output of the cell 58B, and a third programmable bit includes a selection of an AND gate or an OR gate as the final output gate of the cell 58B. In some embodiments, the three programmable bits for a particular logic cell 58B may be programmed by a the image produced by the compiler to perform a selected one of a variety of possible logical operations on the GOT outputs selectively coupled to the logic element. Depending on the logical operations to be performed, any combination of the three programmable bits may be programmed to result in different logical operations through the Boolean logic cell 58B.

As represented by the logic diagram 160, in a particular embodiment, a Boolean logic cell 58B may have, for example, 16 inputs 162 that may be selectively coupled to outputs of other elements, such as GOTs 60, through programming of the lattice. Additionally, a Boolean logic cell may also be selectively couple to other elements in other rows 38, or other elements in other blocks 32, via intra-row switching elements 44, intra-block switching elements 42, and inter-block switching elements 40. Different selective couplings between different elements may be at least partially determined by the image loaded by the compiler 20. The first programmable bit, the inversion of the first input (i.e., the inputs 162) may be applied through the inverting input 166. The inverting input may apply a suitable voltage to inputs of the XOR gates 168, which may function as controlled inverters. In some embodiments, a GOT input 162 may be passed through the XOR gate 168 if the inverting input 166 is low, and the GOT input 162 may be inverted when output through the XOR gate 168 when the inverting input 166 is high.

The output from the XOR gates 168 may be a first input into OR gates 170. A second input into the OR gates 170 may be a mask input line 164. The mask input line 164 may input a high signal in one or more OR gates 170 associated with the inputs 162 to selectively disable one or more inputs 162 or input a low signal in one or more OR gates 170 to selectively enable one or more of the inputs 162. In some embodiments, the mask input line 164 may be determined, for example, by a register setting or by the selective couplings in each row 38 or block 32.

If the mask inputs enable the OR gates 170 to carry through the outputs from the XOR gates 168 (either the GOT inputs 162 or the inverse GOT inputs), the output of the OR gates 170 may be transmitted through a series of AND gates 172 and 176. The first set 172 of AND gates 174 may perform the AND operation on two or more outputs of the OR gate 170 associated with each input 162, and the second set 176 of AND gates 178 may perform an AND operation on the outputs of the first set 172 of AND gates 174.

The outputs of the second set 176 of AND gates may be input into either an AND gate 180 or an OR gate 182. The selection of the AND gate 180 or the OR gate 182 may be the second programmable bit of the Boolean logic cell 58B. The third programming bit includes an inverting output signal 184 which may be input to the XOR gate 186 which may represent a controlled inverter for the output of either the AND gate 180 or the OR gate 182.

In some embodiments, the Boolean logic cell 58B may be used to determine whether a match has occurred after all data in a data stream to be evaluated has been processed. For example, a Boolean logic cell 58B may be used to determine whether a combination of conditions A and B have been detected, where it may be possible that condition A may be detected in a data stream before condition B may be detected in the data stream (or vice versa). For example, the Boolean logic cell 58B may be used to determine a "match at end of data" situation, where a match may only be determined at the end of a data stream. Furthermore, the Boolean logic cell 58B may be used to determine a "this and not that" situation where a match may occur when a condition A (this) has been occurred, and a condition B (that) has not occurred.

In some embodiments, the Boolean logic cell 58B may include an end of data input 188, also referred to as an anchor, which may be coupled to the OR gate 190. The end of data input 188 may be used, for example, to determine a "match at end of data" situation or a "this and not that situation." The end of data input 188 may block the output of the Boolean logic cell 58B until an end of data input 188 is high. The other input of the OR gate 190 may be a mask input 165 which may disable the transmission of the end of data signal 188 through OR gate when the mask input 165 is high or enable the output 192 of the end of data signals 188 when the mask input 165 is low. The end of data output 192 from the OR gate 190 may be input into the AND gate 194. The output 196 from the AND gate 194 is low when the end of data input 188 is low. If the end of data input 188 is high and the output of the XOR gate 186 is also high, the output of the XOR gate 186 may pass through the AND gate 194 as the output 196. Therefore, the output 196 is high only if the output of the XOR gate 186 is high and the end of data signal 192 has been input at the AND gate 194, indicating that the processing of the data stream is complete.

Different programming combinations of the three programmable bits (e.g., the inverting input signal 166, the inverting output signal 184, and the selection between the final outputting AND gate 180 or OR gate 182) may result in 8 (i.e., $2^3$) possible logical functions that may be performed in each Boolean logic cell 58B. Equivalent logic circuit diagrams are represented in FIGS. 12-19, where FIGS. 12-15 functions are a result of not inverting the first inverting input signal 166 and FIGS. 16-19 functions are a result of inverting the first inverting input signal 166. FIGS. 12, 13, 16, and 17 are a result of not inverting the last inverting output signal 184 and FIGS. 14, 15, 18, and 19 are a result of inverting the last inverting output signal 184.

Furthermore, FIGS. 12, 14, 16, and 18 are a result of selecting the AND gate 180 as the final output gate of the Boolean logic cell 58B, and FIGS. 13, 15, 17, and 19 are a result of selecting the OR gate 182 as the final output gate of the Boolean logic cell 58B.

Each of the logical functions represented in FIGS. 12-19 depicts the function performed on an input 162 selectively coupled to an output of an element, such as a GOT 60 in the row 38. However, each function may be performed on one or more inputs selectively coupled to the output(s) of one or more elements, such as GOTs, and more than one function may be performed on the inputs 162 by a Boolean logic cell 58B in each row 38. Moreover, for operations where an entire data set will be processed before a match is determined, each logical function may include the last AND gate 194 which outputs 196 when the end of data signal 188 is input. For operations in which the end of data signal is not considered, the OR gate 190 may be masked by the mask input 165 which may not output the end of data signal to the AND gate 194.

Figure 12:
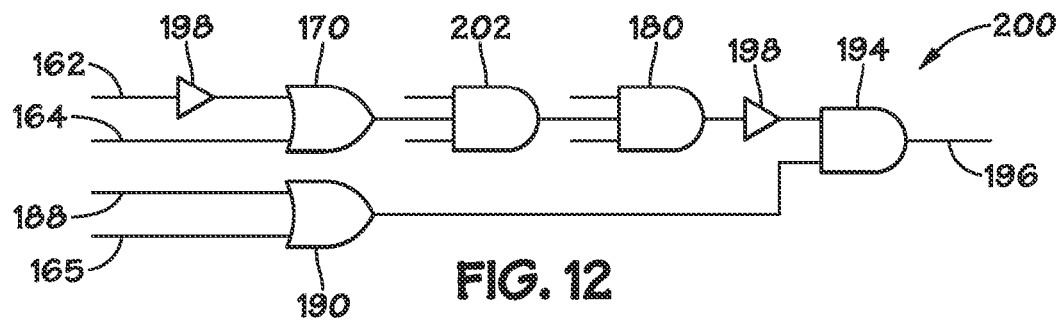
FIG. 12 illustrates a circuit representation of an AND function which may be performed using the Boolean logic cell of FIG. 11, according to various embodiments of the invention.
Figure 13:
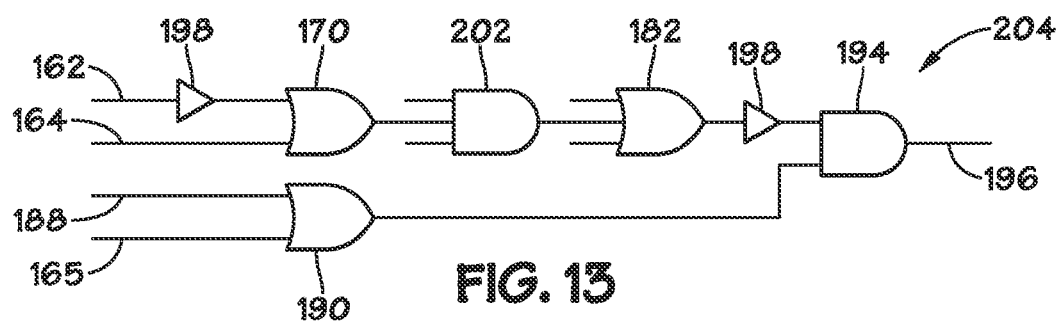
FIG. 13 illustrates a circuit representation of a sum of products (SoP) function which may be performed using the Boolean logic cell of FIG. 11, according to various embodiments of the invention.

FIG. 12 is an equivalent logic circuit diagram 200 of the programmed logic function resulting from a non-inverted input 166, a non-inverted output 184, and a selection of the AND gate 180. The AND gate 202 used in the equivalent logic diagram 200 may represent one or more AND gates (e.g., through AND gate sets 172 and 176 from FIG. 11). The equivalent logic diagram 200 may perform an AND function on the input 162. FIG. 13 is an equivalent logic circuit diagram 204 of the programmed logic function resulting from a non-inverted input 166, a non-inverted output 184, and a selection of the OR gate 182. The equivalent logic diagram 204 may perform a sum of products (SoP) function on the input 162.

Figure 14:
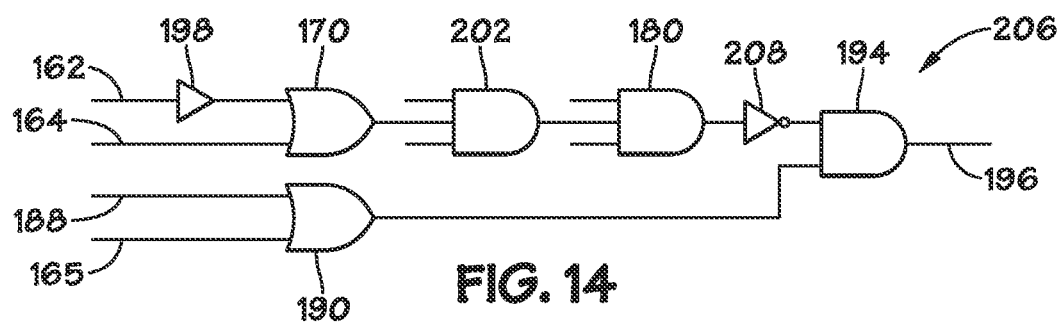
FIG. 14 illustrates a circuit representation of a NAND function which may be performed using the Boolean logic cell of FIG. 11, according to various embodiments of the invention.
Figure 15:
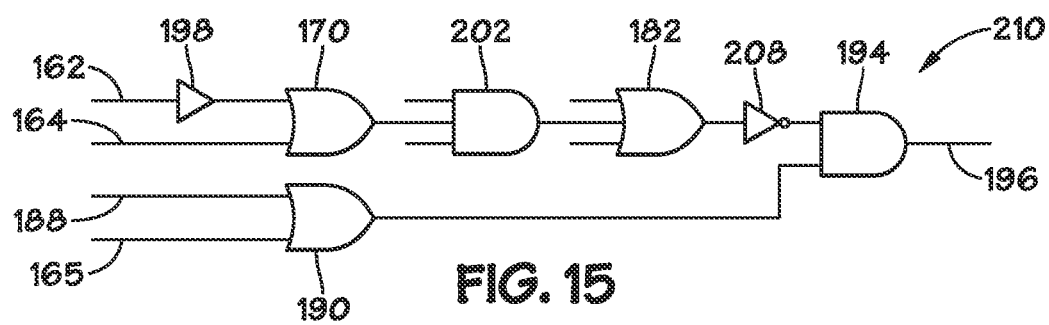
FIG. 15 illustrates a circuit representation of a negated-output sum of products (NSoP) function which may be performed using the Boolean logic cell of FIG. 11, according to various embodiments of the invention.

FIG. 14 is equivalent logic circuit diagram 206 of the programmed logic function resulting from a non-inverted input 166, an inverted output 184 (represented by the inverter 208), and a selection of the AND gate 180. The equivalent logic diagram 206 may perform an NAND function on the input 162. Due to the inversion of the last inverting output 184 in the equivalent logic diagram 206, the output of the NAND function may be an inverse (not AND) of the output of the AND function in the equivalent logic diagram 200. FIG. 15 is an equivalent logic circuit diagram 210 of the programmed logic function resulting from a non-inverted input 166, an inverted output 184 (represented by the inverter 208), and a selection of the OR gate 182. The equivalent logic diagram 210 may perform a negated-output sum of products NSoP function on the input 162. Due to the inversion of the last inverting output 184 in the equivalent logic diagram 210, the output of the NSoP function may be an inverse (negated SoP) of the output of the SoP function in the equivalent logic diagram 204.

Figure 16:
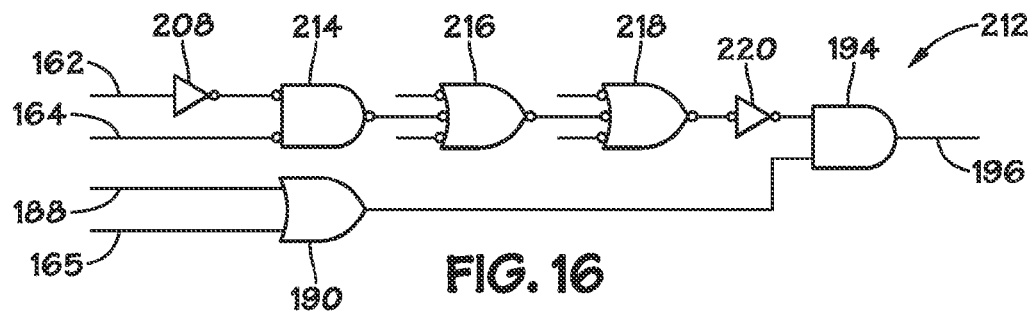
FIG. 16 illustrates a circuit representation of a NOR function which may be performed using the Boolean logic cell of FIG. 11, according to various embodiments of the invention.

FIG. 16 is an equivalent logic circuit diagram 212 of the programmed logic function resulting from an inverted input 166 (represented by the inverter 208), a non-inverted output 184, and a selection of the AND gate 180. The equivalent logic diagram 212 may perform an NOR function on the input 162. Due to the inversion of the first inverting input 166, negative logic elements may be used to represent the logical gates in the NOR function 212. For example, the bubbles at the inputs and outputs of the AND gate 214 may represent inversing at the inputs and outputs, which may make the AND gate 214 a logical equivalent of an OR gate (e.g., OR gate 170). The bubbles at the inputs and outputs for the OR gates 216 and 218 may represent inversing at the inputs and outputs, which make the OR gates 216 and 218 a logical equivalent to two AND gates (e.g., AND gates 202 and 180, respectively). As such, the inversed OR gate 218 may represent the selected AND gate 180. To program the NOR function 212 to have a non-inverting output with an inverted input (represented by 208), the inversing at the input and output of the gate 220 (again represented by the bubbles) may result in a non-inverted buffer gate. 220

Figure 17:
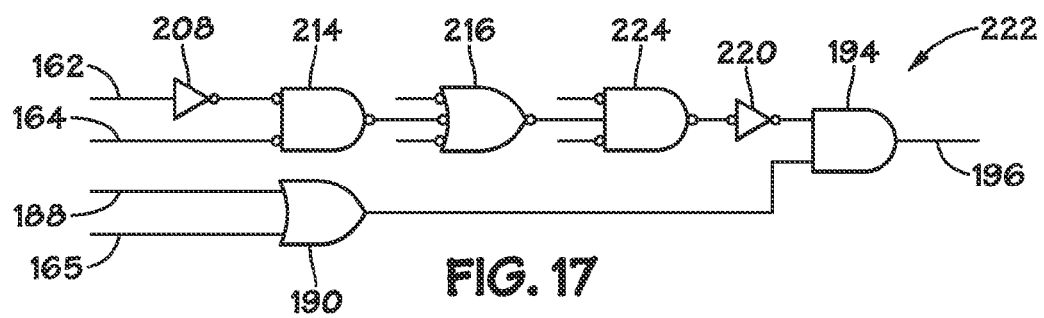
FIG. 17 illustrates a circuit representation of a negated-output product of sums (NPoS) function which may be performed using the Boolean logic cell of FIG. 11, according to various embodiments of the invention.

FIG. 17 is an equivalent logic circuit diagram 222 of the programmed logic function resulting from an inverted input 166 (represented by the inverter 208), a non-inverted output 184 (represented by the buffer gate 220), and a selection of the OR gate 182. The equivalent logic diagram 222 may perform a negated-output product of sums (NPoS) function on the input 162. Due to the inversion of the first inverting input 166, negative logic elements may be used to represent the logical gates in the NPoS function 222. For example, the bubbles at the inputs and outputs of the AND gate 224 may represent inversing at the inputs and outputs, which may make the AND gate 224 a logical equivalent of an OR gate (e.g., OR gate 182). As such, the inversed AND gate 224 may represent the selected OR gate 182.

Figure 18:
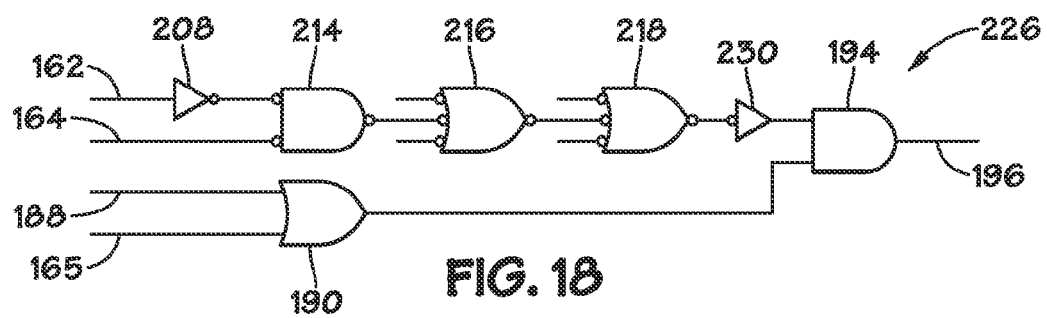
FIG. 18 illustrates a circuit representation of an OR function which may be performed using the Boolean logic cell of FIG. 11, according to various embodiments of the invention.

FIG. 18 is equivalent logic circuit diagram 226 of the programmed logic function resulting from an inverted input 166 (represented by inverter 208), an inverted output 184, and a selection of the AND gate 180 (represented by the negative OR gate 218). The equivalent logic diagram 226 may perform an OR function on the input 162. Due to the inversion of the last inverting output 184 (represented by the inverter 208) negative logic elements may be used to represent the logical gates in the OR function 226. Further, as the output of the OR function 226 is inversed, the input at the gate 230 may be inversed from the inversion of the first input (inverter 208), and the gate 230 may be an active-low input.

Figure 19:
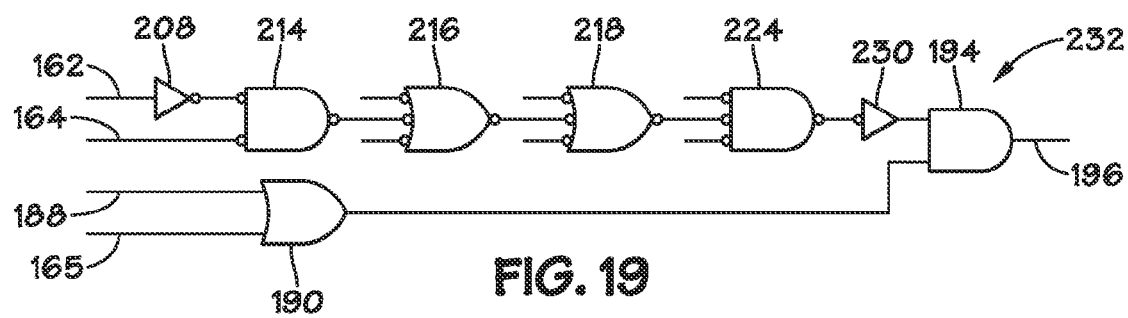
FIG. 19 illustrates a circuit representation of a product of sums (PoS) function which may be performed using the Boolean logic cell of FIG. 11, according to various embodiments of the invention.

FIG. 19 is an equivalent logic circuit diagram 230 of the programmed logic function resulting from an inverted input 166 (represented by the inverter 208), an inverted output 184 (represented by the active-low input gate 230), and a selection of the OR gate 182 (represented by the negative AND gate 224). The equivalent logic diagram 232 may perform a product of sums (PoS) function on the input 162.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A device, comprising:
    a state machine lattice comprising:
        a plurality of blocks each comprising a plurality of rows, each of the rows comprising a plurality of programmable elements, wherein a particular one of the programmable elements is configured to output a signal based on a detection of a condition; and
        at least one of the rows of a particular one of the blocks further comprising a Boolean logic cell configured to be selectively coupleable to any of the programmable elements in any of the plurality of rows of the particular one of the blocks, wherein the Boolean logic cell is configured to output a result of a logical function.

2. The device of claim 1, wherein the logical function is determined by programming an input of the Boolean logic cell to be either inverted or non-inverted, programming an output of the Boolean logic cell to be either inverted or non-inverted, and programming either an AND gate or an OR gate as a final output of the Boolean logic cell.

3. The device of claim 2, wherein the Boolean logic cell is configured to output the result of a NAND function when the input of the Boolean logic cell is programmed to be non-inverted, the output of the Boolean logic cell is programmed to be inverted, and the AND gate is programmed as the final output of the Boolean logic cell.

4. The device of claim 2, wherein the Boolean logic cell is configured to output the result of a NOR function when the input of the Boolean logic cell is programmed to be inverted, the output of the Boolean logic cell is programmed to be non-inverted, and the AND gate is programmed as the final output of the Boolean logic cell.

5. The device of claim 2, wherein the Boolean logic cell is configured to output the result of a negated-output sum of products function when the input of the Boolean logic cell is programmed to be non-inverted, the output of the Boolean logic cell is programmed to be inverted, and the OR gate is programmed as the final output of the Boolean logic cell.

6. The device of claim 2, wherein the Boolean logic cell is configured to output the result of a negated-output product of sums function when the input of the Boolean logic cell is programmed to be inverted, the output of the Boolean logic cell is programmed to be non-inverted, and the OR gate is programmed as the final output of the Boolean logic cell.

7. The device of claim 2, wherein the Boolean logic cell is configured to output the result of a product of sums function when the input of the Boolean logic cell is programmed to be inverted, the output of the Boolean logic cell is programmed to be inverted, and the OR gate is programmed as the final output of the Boolean logic cell.

8. The device of claim 2, wherein the input comprises one of 16 inputs.

9. The device of claim 1, wherein each of the plurality of rows of the particular one of the blocks comprises intra-row circuitry configured to selectively couple any of the plurality of programmable elements of that row with the Boolean logic cell.

10. The device of claim 9, wherein each of the plurality of blocks comprises intra-block circuitry configured to selectively couple any of the plurality of rows of that block, wherein one Boolean logic cell in one of the plurality of rows of that block may be coupled to another Boolean logic cell in another one of the plurality of rows of that block.

11. The device of claim 10, wherein the state machine lattice comprises inter-block circuitry configured to selectively couple any of the plurality of blocks, wherein the Boolean logic cell in the particular one of the plurality of blocks may be selectively coupled to a programmable element in another one of the plurality of blocks via the intra-row circuitry, the intra-block circuitry, and the inter-block circuitry.

12. The device of claim 1, wherein a particular one of the plurality of rows of the particular one of the blocks not comprising a Boolean logic cell comprises a counter, wherein the counter is selectively coupleable to the Boolean logic cell via intra-row circuitry and intra-block circuitry.

13. The device of claim 1, wherein the Boolean logic cell comprises a mask input configured to receive a masking input signal that masks the input of the Boolean logic cell.

14. The device of claim 1, wherein the Boolean logic cell comprises an end of data circuitry, wherein the end of data circuitry is configured such that the Boolean logic cell outputs when the end of data circuitry receives an end of data signal indicating that all data in a data stream has been processed.

15. The device of claim 14, wherein the end of data circuitry comprises an OR gate comprising a mask input and an end of data input and an output connected to an output AND gate, wherein the output AND gate outputs the results of the logical function when the end of data circuitry receives the end of data signal.

16. The device of claim 1, comprising a server, a personal computer, a work station, a router, a network switch, chip test equipment, a laptop, a cell phone, a media player, a game console, or a mainframe computer that comprises the state machine lattice.

17. A method of performing a logic operation at a Boolean logic cell in a state machine lattice, the method comprising:
    processing a data stream in the state machine lattice to detect a plurality of conditions;
    performing a logic function on the detected conditions in a programmable Boolean logic cell in the state machine lattice; and
    outputting a result of the logic function.

18. The method of claim 17, wherein performing the logic function comprises performing one of a NAND function, a NOR function, a negated-output sum of products function, or a negated-output product of sums function.

19. The method of claim 17, comprising receiving an end of data signal at the Boolean element, wherein the end of data signal signifies that the logic function has been performed on the entire data stream.

20. The method of claim 19, comprising outputting the result only when the end of data signal is received at the Boolean logic cell.

21. A method of programming a Boolean logic cell in a state machine lattice, the method comprising programming the Boolean logic cell in the state machine lattice to perform a particular logic function of a plurality of programmable logic functions.

22. The method of claim 21, wherein programming the Boolean logic cell to perform a particular logic function comprises programming the Boolean logic cell to perform a first logic function on one portion of a data stream and programming the Boolean logic cell to perform a second logic function on another portion of the data stream.

23. The method of claim 21, wherein programming the Boolean logic cell to perform a particular logic function comprises programming a first input of the Boolean logic cell to be inverted or non-inverted, programming a last output of the Boolean logic cell to be inverted or non-inverted, and programming an AND gate or an OR gate as a final logic output of the Boolean logic cell.

24. A Boolean logic cell of a state machine lattice, wherein the Boolean logic cell is configured to be selectively coupled to programmable elements in a state machine lattice, wherein the Boolean logic cell is configured to receive inputs from outputs of the programmable elements selectively coupled thereto and to be programmable to perform a selected logic function of a plurality of possible logic functions on the inputs.

25. The element of claim 24, wherein the Boolean logic cell is further configured to:
    receive an anchor signal signifying that an entire data stream has been processed by the Boolean logic cell; and
    output a result of the selected logic function only after the anchor signal is received.

26. The element of claim 24, wherein the Boolean logic cell is configured to be selectively coupled to a counter.

27. The element of claim 24, wherein the possible logic functions comprise an AND function, a sum of products function, a NAND function, a negated-output sum of products function, a NOR function, a negated-output product of sums function, an OR function, and a product of sums function.

\* \* \* \* \*

UNITED STATES PATENT AND TRADEMARK OFFICE
CERTIFICATE OF CORRECTION

PATENT NO. : 9,509,312 B2
APPLICATION NO. : 14/832543
DATED : November 29, 2016
INVENTOR(S) : Harold B Noyes Page 1 of 1

It is certified that error appears in the above-identified patent and that said Letters Patent is hereby corrected as shown below:

In the Claims

Column 22, Line 61, Claim 25, delete "The element of" and insert -- The Boolean logic cell of --, therefor.

Column 23, Line 1, Claim 26, delete "The element of" and insert -- The Boolean logic cell of --, therefor.

Column 23, Line 3, Claim 27, delete "The element of" and insert -- The Boolean logic cell of --, therefor.

Signed and Sealed this
Fifth Day of December, 2017

Joseph Matal
*Performing the Functions and Duties of the
Under Secretary of Commerce for Intellectual Property and
Director of the United States Patent and Trademark Office*